(12) United States Patent
Shimomura et al.

(10) Patent No.: US 7,696,031 B2
(45) Date of Patent: Apr. 13, 2010

(54) METHOD FOR MANUFACTURING SEMICONDUCTOR DEVICE

(75) Inventors: Akihisa Shimomura, Atsugi (JP);
Hironobu Shoji, Machida (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 267 days.

(21) Appl. No.: 11/150,285

(22) Filed: Jun. 13, 2005

(65) Prior Publication Data
US 2005/0277236 A1 Dec. 15, 2005

(30) Foreign Application Priority Data
Jun. 14, 2004 (JP) ............... 2004-176220

(51) Int. Cl.
*H01L 21/00* (2006.01)
*H01L 21/44* (2006.01)
(52) U.S. Cl. .............. 438/166; 257/E21.134; 438/487
(58) Field of Classification Search .......... 438/486, 438/487, 149, 166; 257/E21.134
See application file for complete search history.

(56) References Cited

U.S. PATENT DOCUMENTS

| | | | |
|---|---|---|---|
| 6,100,562 A * | 8/2000 | Yamazaki et al. | 257/347 |
| 6,322,625 B2 | 11/2001 | Im | |
| 6,839,108 B1 * | 1/2005 | Hirakata et al. | 349/114 |
| 2001/0001745 A1 | 5/2001 | Im et al. | |
| 2001/0055830 A1 | 12/2001 | Yoshimoto | |
| 2004/0161913 A1 | 8/2004 | Kawasaki et al. | |

FOREIGN PATENT DOCUMENTS

| | | |
|---|---|---|
| JP | 3204986 | 6/2001 |
| JP | 3204986 | 9/2001 |
| JP | 2002-057344 | 2/2002 |
| JP | 2002-083820 | 3/2002 |
| JP | 2002-261013 | 9/2002 |

OTHER PUBLICATIONS

H.J. Kim et al., *Grain Boundary Location-Controlled Poly-Si Films for TFT Devices Obtained Via Novel Excimer Laser Process*, Materials Research Society Symp. Proc., vol. 358, 1995, pp. 903-908.

* cited by examiner

*Primary Examiner*—W. David Coleman
*Assistant Examiner*—Sonya D McCall-Shepard
(74) *Attorney, Agent, or Firm*—Eric J. Robinson; Robinson Intellectual Property Law Office, P.C.

(57) ABSTRACT

It is an object of the present invention to control the position in crystal lateral growth of a semiconductor film without making a system cumbersome and complicated.

A method for manufacturing a semiconductor device according to the present invention includes the step of forming a semiconductor film over an insulating substrate, forming a reflective film comprising an insulating film on the semiconductor film, exposing a portion of the semiconductor film by patterning of the reflective film, and crystallizing the exposed semiconductor film by irradiating the exposed semiconductor film with laser light while using the patterned reflective film as a mask. In the above-described method according to the present invention, the reflective film has a structure in which an insulating film that has a higher refractive index and an insulating film that has a lower refractive index are stacked alternately.

50 Claims, 13 Drawing Sheets

Structure used in simulations

107

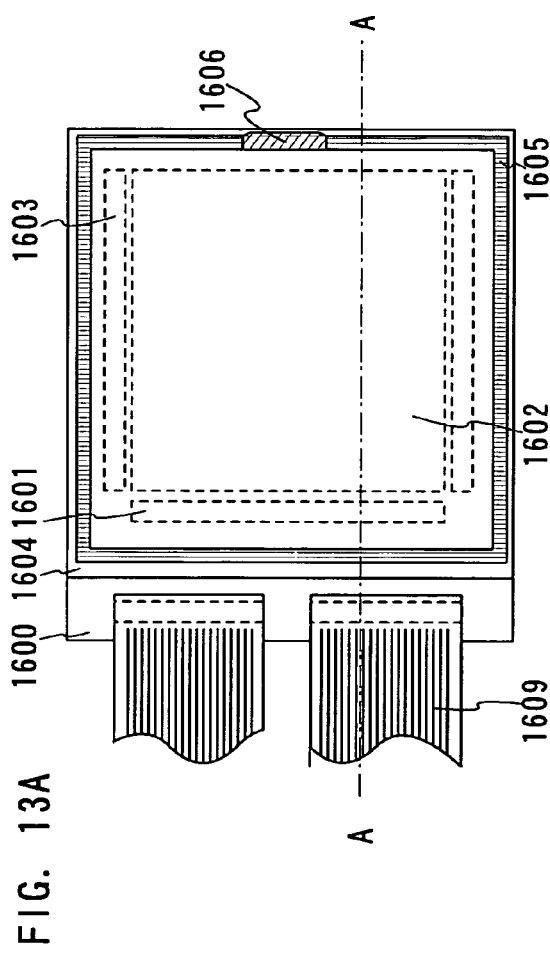
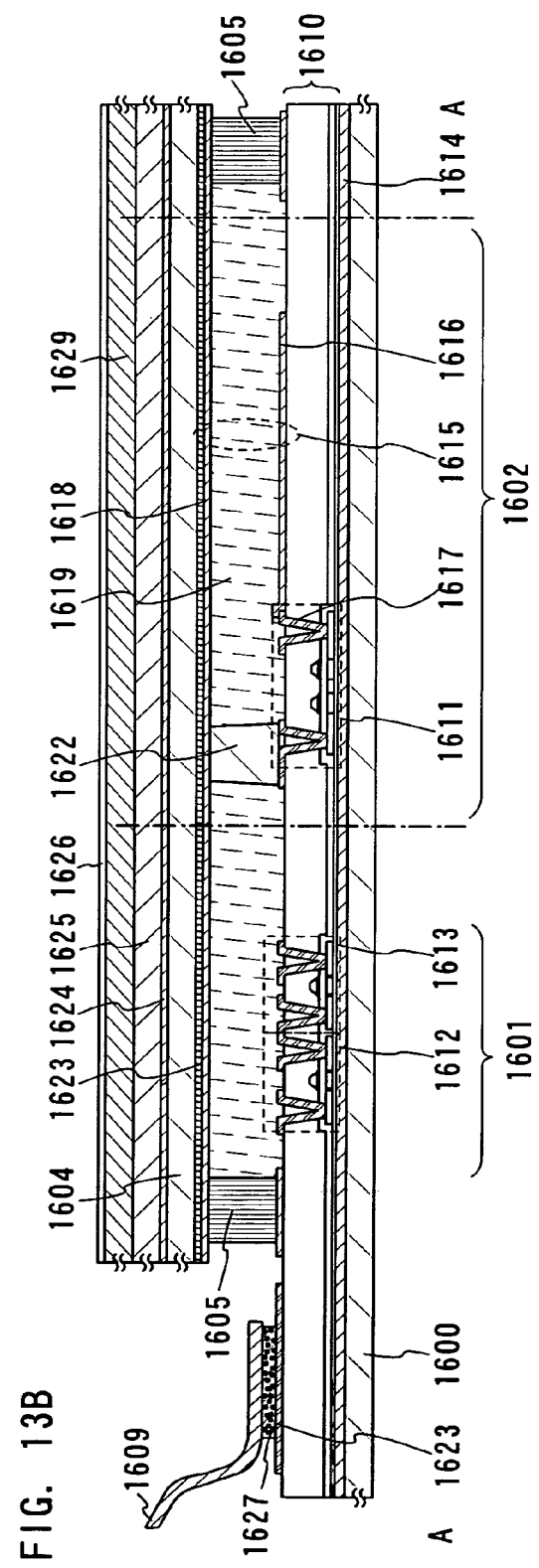
FIG. 13A
FIG. 13B

METHOD FOR MANUFACTURING SEMICONDUCTOR DEVICE

BACKGROUND OF THE INVENTION

1. Field of the Invention

The present invention relates to a method for manufacturing a semiconductor device, and more particularly, relates to a method for manufacturing a semiconductor device that has a thin film transistor (hereinafter, abbreviated as "TFT" in this specification) formed with the use of a semiconductor film, where the semiconductor film is formed due to lateral crystal growth of a semiconductor film formed over an insulating substrate by laser light irradiation.

2. Description of the Related Art

Recently, a technique of crystallizing a semiconductor film (particularly, an amorphous semiconductor film) formed over an insulating substrate such as glass or improving the crystallinity of the semiconductor film by laser annealing has been widely studied. For the semiconductor film, silicon is typically used.

A glass substrate has more workability as compared with a synthesized quartz glass substrate that is often used conventionally, and has the advantage of being able to manufacture a large-area substrate. However, a glass substrate has a lower melting point as compared with a synthesized quartz glass substrate, and thus has the disadvantage that heating is not able to be performed so much in a process of crystallizing a semiconductor film formed over the glass substrate. Consequently, a method using a laser is often used as a method for crystallizing a semiconductor film formed over a glass substrate. This is because high energy can be given to only an amorphous semiconductor film by the laser without increasing the temperature of a substrate so much.

A crystalline semiconductor film formed by laser annealing has a high mobility. Therefore, TFTs formed with the use of this crystalline semiconductor film are extensively used for a monolithic liquid-crystal electro-optical device in which TFTs of a driver circuit and a pixel portion are formed over the same substrate, and the like.

Further, a method is industrially excellent in productivity, and thus is widely used. In the method, a laser beam by pulsed oscillation that is powerful such as an excimer laser is processed by an optical system to be a several-centimeter square spot or a linear shape 10 cm or more in length at a surface to be irradiated, and laser annealing is performed while scanning the laser beam relatively with respect to the surface to be irradiated.

In particular, when a linear beam is used, the productivity is high since the whole of a surface to be irradiated can be irradiated with the laser beam by scanning only in a direction perpendicular to the longitudinal direction of the linear beam unlike a case of using a spot-shaped laser beam and thus requiring scanning from front to back and from side to side. The reason of the scanning in the direction perpendicular to the longitudinal direction is that the direction is the most efficient scanning direction. Due to this high productivity, the use of a linear beam obtained by processing a laser beam of a pulsed-oscillation excimer laser by an appropriate optical system in laser annealing is now becoming mainstream in manufacturing technology of a device such as a liquid crystal display device using a TFT. Further, this technique makes it possible to manufacture a monolithic liquid crystal display device in which TFTs of a driver circuit provided at the periphery of a pixel portion are integrally formed.

However, a crystalline semiconductor film that is manufactured by laser annealing is formed of an aggregate of a plurality of crystal grains, and the crystal grains are random in position and size. A TFT that is manufactured over a glass substrate is formed by separating the crystalline semiconductor film into island-shaped patterns for element separation. However, in this case, it is not possible to specify the positions and sizes of the crystal grains to form the TFT. There are an infinite number of recombination centers and trapping centers derived from amorphous structures and crystal defects at interfaces of the crystal grains (grain boundaries) as compared with within the crystal grains. When a carrier is trapped in this trapping center, the current transporting property of the carrier is known to be decreased since the potential of the grain boundary is increased to become a barrier against the carrier. While the crystallinity of a semiconductor film of a channel forming region has an important effect on electrical characteristics of a TFT, it is almost impossible to form the channel forming region with the use of a single-crystal semiconductor film by eliminating effects of the grain boundaries.

In order to solve these problems, there have been various attempts to form crystal grains that are subjected to position control and are large in grain size in laser annealing. The solidification process of a semiconductor film after irradiating the semiconductor film with a laser beam will be described below.

It takes some time to generate a crystal nucleus in the semiconductor film melted completely by laser beam irradiation, an infinite number of crystal nucleuses are generated uniformly (or non-uniformly) in a completely melted region of the semiconductor film, and crystal growth is terminated to complete the solidification process of the completely melted semiconductor film. The crystal grains obtained in this case are random in position and size.

Alternatively, when the semiconductor film is not completely melted by laser beam irradiation so that a solid-phase semiconductor region partly remains, crystal growth proceeds from the solid-phase semiconductor region after laser beam irradiation. As previously mentioned, it takes some time to generate a crystal nucleus in the completely melted semiconductor film. Therefore, until a crystal nucleus is generated in the completely melted semiconductor film, a solid-liquid interface that is a head of crystal growth (which indicates a boundary between the solid-phase semiconductor region and the completely melted region) moves in a parallel direction (hereinafter, referred to as "a lateral direction") with respect to the surface of semiconductor film so that a crystal grain grows to many times its film thickness. Such growth is completed in such a way that an infinite number of crystal nucleuses are generated uniformly (or non-uniformly) in a completely melted region and crystal growth is terminated. Hereinafter, this phenomenon is referred to as super lateral growth.

In the case of an amorphous semiconductor film or a polycrystalline semiconductor film, there is an energy region of a laser beam for achieving the super lateral growth. However, the energy region is quite narrow, and it is not possible to control positions in which crystal grains that are large in grain size are obtained. Further, a region other than the crystal grains that are large in gain size is a microcrystalline region in which an infinite number of crystal nucleuses are generated or an amorphous region.

As described above, when the temperature gradient in a lateral direction can be controlled (a heat flow in the lateral direction can be generated) in an energy region of a laser beam for completely melting a semiconductor film, the position and direction in growth of a crystal grain can be controlled. In order to accomplish this method, there have been various attempts.

First, as a reflective film, a metal film (a Cr single layer or a lamination layer of a Cr film and an Al film stacked on the Cr film) is formed on an amorphous semiconductor film, and is partially etched to form a region with the metal film on the amorphous semiconductor film and a region without the metal film. At a wavelength of 308 nm, the reflectivity of Cr is approximately 60%, and the reflectivity of Al is approximately 90%. Therefore, when a laser beam with a wavelength of 308 nm is used to irradiate the amorphous semiconductor film, the amorphous semiconductor region below the metal film is less irradiated with the laser beam as compared with the amorphous semiconductor covered with no metal film. Namely, a temperature gradient is generated between the amorphous semiconductor region below the metal film and the amorphous semiconductor covered with no metal film. Therefore, a crystal nucleus generated in the amorphous semiconductor region below the metal film is known to laterally grow to the amorphous semiconductor covered with no metal film, which is kept in a melted state, and to form a crystal grain of 1 to 2 µm.

However, this method has the following problems. In the method of performing crystallization by forming the metal film partially on the amorphous semiconductor film and performing laser beam irradiation, it is difficult to control the position of a crystal grain on a single crystal basis while a position in which a crystal grain is formed can be controlled. In addition, since the metal film is formed directly on the amorphous semiconductor film, the metal element diffuses into the amorphous semiconductor film, and there is a possibility that deterioration in electrical characteristics of a TFT is caused when the TFT is manufactured with the use of a crystalline semiconductor manufactured by crystallizing the amorphous semiconductor film. In addition, there is a possibility that cracks and peeling is generated in the metal film and the amorphous semiconductor film. The metal film is typically formed by sputtering. As compared with CVD, sputtering shows larger in-plane variations in film thickness when the metal film is formed. Therefore, when substrates are larger, it can be said that the use of sputtering is not preferable in the feature.

Further, James S. Im et al. show a Sequential Lateral Solidification method (hereinafter, referred to as "an SLS method") by which super lateral growth can be achieved in any position (for example, refer to Patent Reference 1).

(Patent Reference 1) Japanese Patent No. 3204986

In the SLS method, crystallization is performed while a mask in the shape of a slit is moved on the order of the distance of super lateral growth (approximately 0.75 µm) for every shot.

The use of the SLS method makes lateral growth possible by irradiating an amorphous silicon film formed on a glass substrate with an extra fine beam on the order several microns, where the extra fine beam is obtained by condensing an excimer laser beam passed through a slit. In addition, lateral growth can be proceed continuously by controlling the substrate feed pitch for every shot to be the distance of lateral growth. However, the use of the SLS method has the following problems.

Since an excimer laser is not so good in quality, it is necessary that a mask for condensing light into several µm be used in a laser irradiation system in order to use the SLS method. Further, the mask needs to be replaced periodically, and an automatic focus function for keeping a focal depth constant is indispensable in order to keep a focal point uniformly in the surface of a substrate since a lens that has a short focal length also has a shallow focal depth. As a result, the system becomes complicated and expensive as compared with a typical laser irradiation system.

SUMMARY OF THE INVENTION

In view of the problems described above, it is an object of the present invention to control the position in crystal lateral growth of a semiconductor film without making a system cumbersome and complicated.

Further, it is an object of the present invention to control the position in crystal lateral growth of a semiconductor film by using a laser beam from a laser annealing system without modification.

In addition, it is an object of the present invention to provide a TFT that is capable of high-speed operation by manufacturing a crystalline semiconductor film in which the position and size of a crystal grain is controlled and using the crystalline semiconductor film for a channel forming region of the TFT. Further, it is an object of the present invention to provide a technique for applying such a TFT to various semiconductor device such as a liquid crystal display device or a display device using an electroluminescence material.

According to the present invention, a reflective film is formed on a semiconductor film in order to control the position in crystal lateral growth of the semiconductor film. Then, a portion of the semiconductor film is exposed by patterning of the reflective film, and the exposed semiconductor film is irradiated with laser light to crystallize the exposed semiconductor film.

A method for manufacturing a semiconductor device according to the present invention, which is disclosed in this specification, includes the steps of forming a semiconductor film over an insulating substrate; forming a reflective film comprising an insulating film over the semiconductor film; exposing a portion of the semiconductor film by patterning the reflective film; and crystallizing the exposed semiconductor film by irradiating a laser light using the patterned reflective film as a mask.

In addition, another method for manufacturing a semiconductor device according to the present invention, which is disclosed in this specification, includes the steps of forming a base film over an insulating substrate; forming a semiconductor film on the base film, the semiconductor film having a first region and second region; forming a reflective film comprising an insulating film on the semiconductor film; exposing the first region of the semiconductor film by patterning the reflective film, wherein the second region is covered with the reflective film; crystallizing the first region of the semiconductor film by irradiating the first region of the semiconductor film with a laser light using the patterned reflective film as a mask; removing the patterned reflective film; patterning the semiconductor film; forming a gate insulating film on the patterned semiconductor film; and forming a gate electrode on the insulating film, wherein the gate electrode is formed over the crystallized first region.

In addition, another method for manufacturing a semiconductor device according to the present invention, which is disclosed in this specification, includes the steps of forming a base film over an insulating substrate; forming a semiconductor film on the base film; irradiating the semiconductor film with a first laser light, the irradiated semiconductor film having a first region and second region; forming a reflective film comprising an insulating film on the irradiated semiconductor film; exposing the first region of the irradiated semiconductor film by patterning the reflective film, wherein the second region is covered with the reflective film; crystallizing the first region of the semiconductor film by irradiating a second laser light using the patterned reflective film as a mask; removing the patterned reflective film; patterning the semiconductor film; forming a gate insulating film on the patterned semiconductor film; and forming a gate electrode on the gate insulating film, wherein the gate electrode is formed over the crystallized first region.

In addition, another method for manufacturing a semiconductor device according to the present invention, which is disclosed in this specification, includes the steps of forming a base film over an insulating substrate; forming a semiconductor film on the base film; crystallizing the semiconductor film by irradiating a first laser light, the crystallized semiconductor film having a first region and second region; forming a reflective film comprising an insulating film on the crystallized semiconductor film; exposing the first region of the crystallized semiconductor film by patterning the reflective film, wherein the second region is covered with the reflective film; improving crystallinity of the first region of the crystallized semiconductor film while keeping orientation of the crystallized semiconductor film by irradiating a second laser light using the patterned reflective film as a mask.

In addition, another method for manufacturing a semiconductor device according to the present invention, which is disclosed in this specification, includes the steps of forming a semiconductor film over an insulating substrate; forming a reflective film comprising an insulating film over a portion of the semiconductor film; and crystallizing the exposed semiconductor film by irradiating a laser light using the patterned reflective film as a mask, wherein the portion of the semiconductor film is covered by the reflective film.

In addition, another method for manufacturing a semiconductor device according to the present invention, which is disclosed in this specification, includes the steps of forming a semiconductor film over an insulating substrate; forming a reflective film comprising an insulating film over a portion of the semiconductor film; and crystallizing the exposed semiconductor film by irradiating a laser light using the patterned reflective film as a mask, wherein the portion of the semiconductor film is covered by the reflective film, wherein a portion of the semiconductor film, which is not covered with the reflective film, is irradiated with the laser light, and wherein the laser light is reflected by the reflective film.

In addition, another method for manufacturing a semiconductor device according to the present invention, which is disclosed in this specification, includes the steps of forming a semiconductor film over an insulating substrate; forming a reflective film comprising an insulating film over a portion of the semiconductor film; and crystallizing the exposed semiconductor film by irradiating a laser light using the patterned reflective film as a mask, wherein the portion of the semiconductor film is covered by the reflective film, and wherein the portion of the semiconductor film is not melted by the irradiation of the laser light.

In each of the above-described methods according to the present invention, the reflective film has a structure in which an insulating film that has a higher refractive index and an insulating film that has a lower refractive index are stacked alternately. Specifically, the reflective film comprises a silicon oxide film and a silicon nitride film formed in contact with the silicon oxide film. More preferably, the reflective film is formed by stacking some silicon oxide films and silicon nitride films.

In addition, in each of the above-described methods according to the present invention, the reflective film is formed by CVD typified by plasma CVD or low-pressure CVD.

In addition, in each of the above-described methods according to the present invention, patterning of the reflective film is performed by dry etching.

In addition, in each of the above-described methods according to the present invention, the patterned reflective film is removed by wet etching.

In addition, in each of the above-described methods according to the present invention, the crystallization proceeds by crystal grow in a lateral direction, and crystal growth proceeds in a lateral direction from a region comprising the semiconductor film provided below the patterned reflective film to a region comprising the exposed semiconductor film.

In addition, in each of the above-described methods according to the present invention, a thin film transistor is formed so that a direction in which a carrier moves in a channel forming region of the thin film transistor is parallel to the lateral direction in which crystal growth proceeds.

According to the present invention, a reflective film is formed on a semiconductor film in order to control the position in crystal lateral growth of the semiconductor film. Then, a portion of the semiconductor film is exposed by patterning of the reflective film, and the exposed semiconductor film is irradiated with laser light to crystallize the exposed semiconductor film. Therefore, a laser irradiation system has no need to use a mask for condensing light to be several μm, an excimer layer that is conventionally used can be used without modification, and it is also possible to grow an epitaxial-growth crystal and a lateral-growth crystal separately within a surface of a substrate.

In addition, since it is not necessary to purchase a new system, the cost can be reduced.

In addition, when the reflective film has a structure in which an insulating film that has a higher refractive index and an insulating film that has a lower refractive index are stacked alternately, the following effects can be obtained. Namely, the more lamination layer patterns of an insulating film that has a higher refractive index and an insulating film that has a lower refractive index are stacked, the more the reflectivity can be increased, and a structure for obtaining a desired reflectivity can be formed easily. Further, since the total film thickness of a reflective film formed by stacking can be made smaller as compared with a reflective film of a single-layer film, etching time can be reduced when the reflective film formed by stacking is subjected to patterning or is removed after crystallization. This is because a reflective film of a single-layer film serves as an antireflective film when the reflective film is formed to have a thin film thickness.

In addition, the semiconductor film is less contaminated as compared with a case of using a metal film for the reflective film. Typically, a metal film is formed by sputtering because, for example, it is necessary to a poisonous gas as a gas for deposition when the metal film is formed by CVD. However, when a substrate is getting larger, in-plane variations in film thickness during deposition are caused more easily in sputtering as compared with CVD, and cracks and pealing are easily caused when the reflective film is removed.

The reflective film used in the present invention is not subjected to any restrictions when the reflective film is formed by CVD. Therefore, there is no need to concern cracks or pealing when the reflective film is removed.

In the case of using an insulating film of a single layer as a reflective film, the reflectivity of the insulating film varies due to variations in film thickness of the insulating film. This variation of the reflectivity influences the melting time of a semiconductor film, which causes the variation in lateral growth of the semiconductor film. On the other hand, the variation of reflectivity in the present invention is smaller than that of the case of using the insulating film of the single layer because the reflective film according to the present invention is formed by stacking at least two insulating films one of which has a higher refractive index than the other.

In addition, a TFT that is excellent in electrical characteristics such as a field effect mobility (a coefficient of a carrier transfer rate to a field) and a subthreshold coefficient (an S value) can be obtained by forming the TFT with the use of a crystalline semiconductor film obtained according to the present invention. Further, this TFT is used most appropriately when an integrated circuit required to have high characteristics such as a high response speed is manufactured.

BRIEF DESCRIPTION OF THE DRAWINGS

In the accompanying drawings:

FIGS. 13A and 13B are diagrams illustrating Embodiment 8 of the invention;

DETAILED DESCRIPTION OF THE INVENTION

Figure 1A:
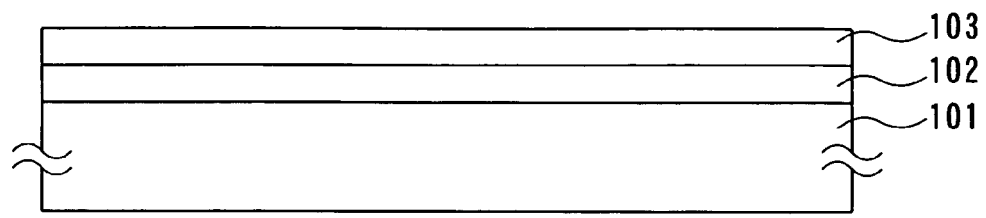
FIGS. 1A to 1D are diagrams illustrating the best mode for carrying out the present invention.

The best mode for carrying out the present invention will be described with reference to FIGS. 1A to 1D. It is to be noted that the same reference numeral is used for description also in a different drawing when the same object is denoted in a mode to be described below according to the present invention.

FIGS. 1A to 1D are cross-sectional views illustrating a process for manufacturing a semiconductor device by carrying out the invention.

First, as shown in FIG. 1A, a base film 102 is formed on an insulating substrate 101 such as a glass substrate or a quartz substrate. As a method for forming the base film 102, a known method such as CVD typified by plasma CVD or low-pressure CVD or sputtering may be used.

Next, a semiconductor film 103 is formed on the base film 102. As the semiconductor film 103, an amorphous semiconductor film such as an amorphous silicon film may be formed. Alternatively, a microcrystalline semiconductor film or a crystalline semiconductor film may be formed.

Figure 1B:
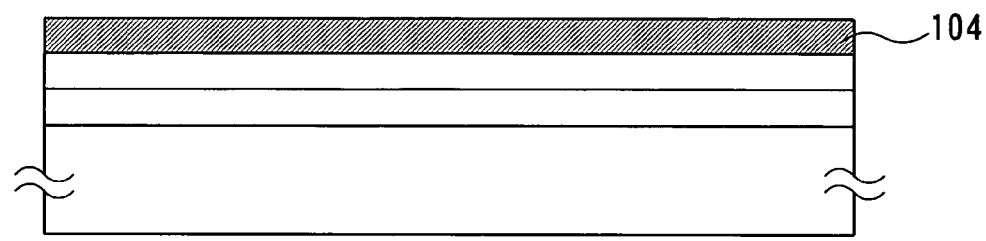
Figure 16A:
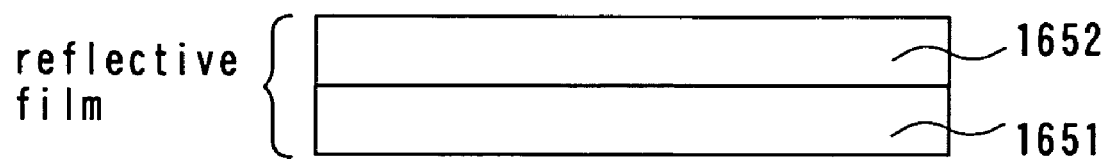
FIGS. 16A and 16B are diagrams illustrating examples of the structure of a reflective film.
Figure 16B:
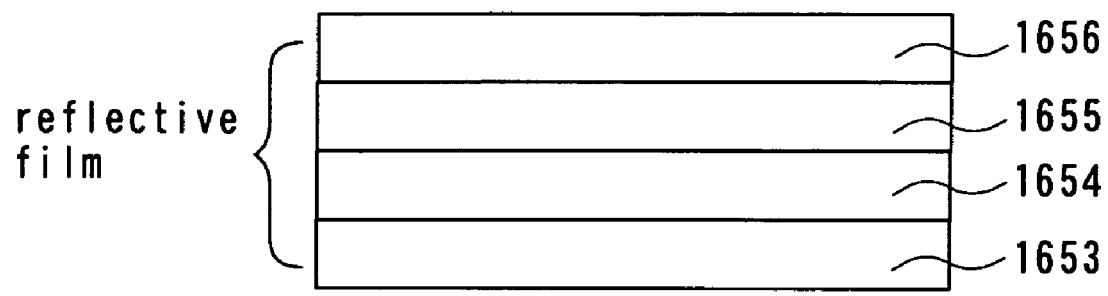

Next, as shown in FIG. 1B, a reflective film 104 is formed on the semiconductor film 103. For the reflective film 104, a structure in which an insulating film that has a higher refractive index and an insulating film that has a lower refractive index are stacked alternately may be used. For example, as shown in FIG. 16A, a structure in which a silicon oxynitride film (an SiOxNy film, where x>y, x and y are positive integers) 1651 and a silicon oxynitride film (an SiNxOy film, where x>y, x and y are positive integers) 1652 are stacked over the substrate in this order may be used, or as shown in FIG. 16B, a structure in which a first silicon oxynitride film (an SiOxNy film, where x>y, x and y are positive integers) 1653, a first oxynitride film (an SiNxOy film, where x>y, x and y are positive integers) 1654, a second silicon oxynitride film (an SiOxNy film, where x>y, x and y are positive integers) 1655, and a second oxynitride film (an SiNxOy film, where x>y, x and y are positive integers) 1656 are stacked over the substrate in this order may be used. What is of paramount importance in the manufacturing process according to the invention is a reflective film is formed without using a metal film as described above.

Figure 1C:
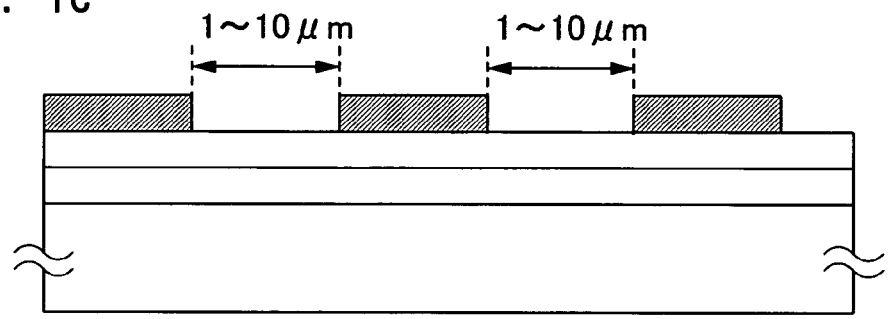

Next, as shown in FIG. 1C, patterning of the reflective film 104 is patterned to expose a portion of the semiconductor film 103. The reference numeral of the region covered with the patterned reflective film is 110, and the reference numeral of the region not covered with the patterned reflective film is 111. As a method for patterning, a known patterning technique may be used. However, patterning by dry etching is more preferable. This is because the use of dry etching makes it possible to perform anisotropic etching, and patterning can be thus more controlled.

Figure 1D:
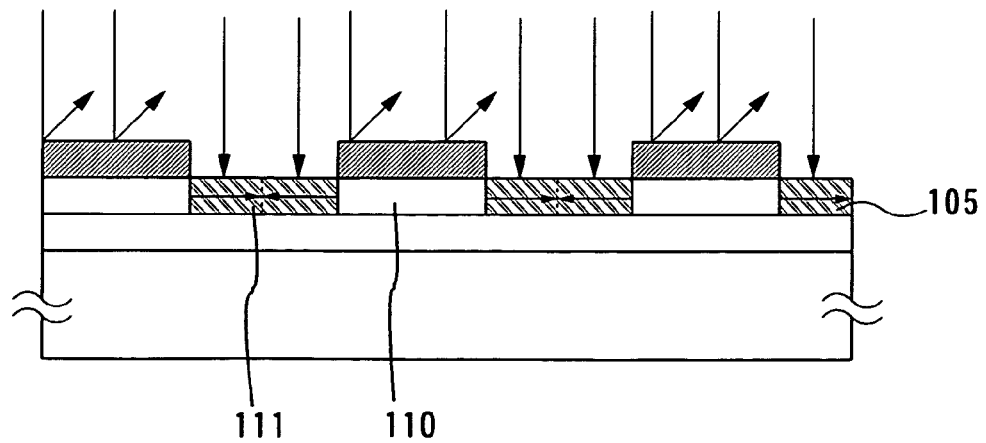

Next, as shown in FIG. 1D, laser light irradiation is performed with a patterned reflective film as a mask. The process from the laser light irradiation to crystallization of the semiconductor film 103 will be described.

When the semiconductor film 103 is irradiated with laser light, the region 111 becomes a completely melted region.

On the other hand, laser light is reflected in the region 110 so that the region is made to be below threshold energy required for crystallization of the semiconductor film 103. Namely, the region 110 does not melt, and can be said to be a solid-phase semiconductor region. It is to be noted that laser light is illustrated in FIG. 1D for the sake of simplicity as if laser light is reflected only by the surface of the reflective film 104. However, in fact, laser light also enters the reflective film 104, and is reflected by the boundary surface of each insulating film constituting the reflective film 104. In addition, laser light is reflected also by the interface between the lowest layer of the stacked insulating films constituting the reflective film 104 and the semiconductor film 103 although the reflected ratio itself is small. It is preferable to design the film thickness of each stacked insulating film constituting the reflective film 104 so that at least a portion of reflected light that returns to the incidence side is coherent. More preferably, the film thickness of each stacked insulating film constituting the reflective film 104 may be designed so that all reflected light that returns to the incidence side is coherent. In these cases, the intensity of reflected light is increased by interference effect.

A temperature gradient is generated the completely melted region and the solid-phase semiconductor region. It takes a certain amount of time to generate a crystal nucleus in the solid-phase semiconductor region. Therefore, until a crystal nucleus is generated in the solid-phase semiconductor region, a solid-liquid interface that is a head of crystal growth (which indicates a boundary between the solid-phase semiconductor region and the completely melted region) moves in a lateral direction with respect to the surface of the semiconductor film 103 so that a crystal grain grows. Then, as for this growth, crystal grains in process of crystal growth come in contact with each other at the center of the region 111 (at a dotted line of a crystalline semiconductor film 105) to terminate the crystal growth. In addition, at the same time, a ridge is formed at the surface in the vicinity of the center of the region 111. In this specification, the word "ridge" indicates a protrusion which is formed by contact of crystal grains grown in crystallization by use of a laser light. In this way, the semiconductor film 103 is crystallized to form the crystalline semiconductor film 105 in which the position and direction in growth of a crystal grain are controlled.

Laser light to be used in this step is laser light by pulsed oscillation, and any kind of laser light may be used as long as the laser light can be produced by pulsed oscillation. For example, any one of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti:sapphire laser, a copper vapor laser, and a gold vapor laser can be used.

In addition, the energy density of a laser beam for irradiation is changed depending on conditions such as the film thickness of a semiconductor film, the pulse width and wavelength of the laser beam for irradiation. For example, when a semiconductor film 50 nm in film thickness is crystallized by a XeCl excimer laser, laser irradiation may be performed at an energy density of 400 to 1000 $mJ/cm^2$.

In addition, the shape of the laser beam may be processed into a linear shape, or may be processed into a planar shape.

The present invention makes it possible to laterally grow the region 111 by controlling the width between adjacent reflective films to each other (the width of a slit) to be 1 to 10 μm (preferably 2 to 3 μm) as shown in FIG. 1C. Namely, when the width of a slit is 10 μm or more, a solidified region (a seed crystal) is generated partly before lateral growth of a completely melted region by laser irradiation, and thus, the present invention becomes not able to be carried out.

Next, the patterned reflective film 104 is all removed. As a method for removing the patterned reflective film 104, a known etching technique may be used, and more preferably, the patterned reflective 104 may be removed by wet etching. This is because the use of wet etching makes it possible to increase the etching electivity of the silicon oxide film to be used for the reflective film 104 to the crystalline semiconductor film 105 more as compared with dry etching. Namely, the use of wet etching makes it possible to remove the reflective film 104 without overetching of the crystallized semiconductor film.

In accordance with the steps described above, a crystalline semiconductor film in which the position and direction in growth of a crystal grain are controlled can be obtained.

Embodiment 1

In the present embodiment, a process for manufacturing a crystalline semiconductor film and manufacturing TFTs with the use of the obtained crystalline semiconductor film will be described with reference to FIGS. 1A to 1D and FIGS. 2A to 2E.

First, as shown in FIG. 1A, a base film 102 is formed on an insulating substrate 101 such as a glass substrate or a quartz substrate. As a method for forming the base film 102, a known method such as CVD typified by plasma CVD or low-pressure CVD or sputtering may be used. In addition, the base film 102 may have a single-layer structure using any one of a silicon oxide film (SiOx film), a silicon nitride film (SiNx film), a silicon oxynitride film (an SiOxNy film, where x>y, x and y are positive integers), and a silicon oxynitride film (an SiNxOy film, where x>y, x and y are positive integers), or may have a structure in which some of these films are stacked appropriately may be used. In the present embodiment, a structure in which a silicon oxynitride film (an SiNxOy film, where x>y, x and y are positive integers) and a silicon oxynitride film (an SiOxNy film, where x>y, x and y are positive integers) are stacked to be 50 nm and 100 nm respectively is used for the base film 102.

Next, a semiconductor film 103 is formed on the base film 102. As the semiconductor film 103, an amorphous semiconductor film may be formed. Alternatively, a microcrystalline semiconductor film or a crystalline semiconductor film may be formed. In addition, although a material for the semiconductor film 103 is not limited, it is preferable to use silicon or silicon germanium (SiGe). In the present embodiment, an amorphous silicon film is formed to be 54 nm. It is to be noted that a step of removing hydrogen included in the semiconductor film 103 may be conducted after forming the semiconductor film 103. Specifically, heating at 500° C. for 1 hour may be conducted.

In addition, when the interface between the base film 102 and the semiconductor film 103 is not exposed to the air during forming the base film 102 and the semiconductor film 103, it becomes possible to prevent contamination of the interface, and variations in characteristics an be reduced. In the present embodiment, the base film 102 and the semiconductor film 103 are continuously formed by plasma CVD without exposing to the air.

Next, as shown in FIG. 1B, a reflective film 104 is formed on the semiconductor film 103. For the reflective film 104, a structure in which insulating films are stacked may be used.

Figure 3:
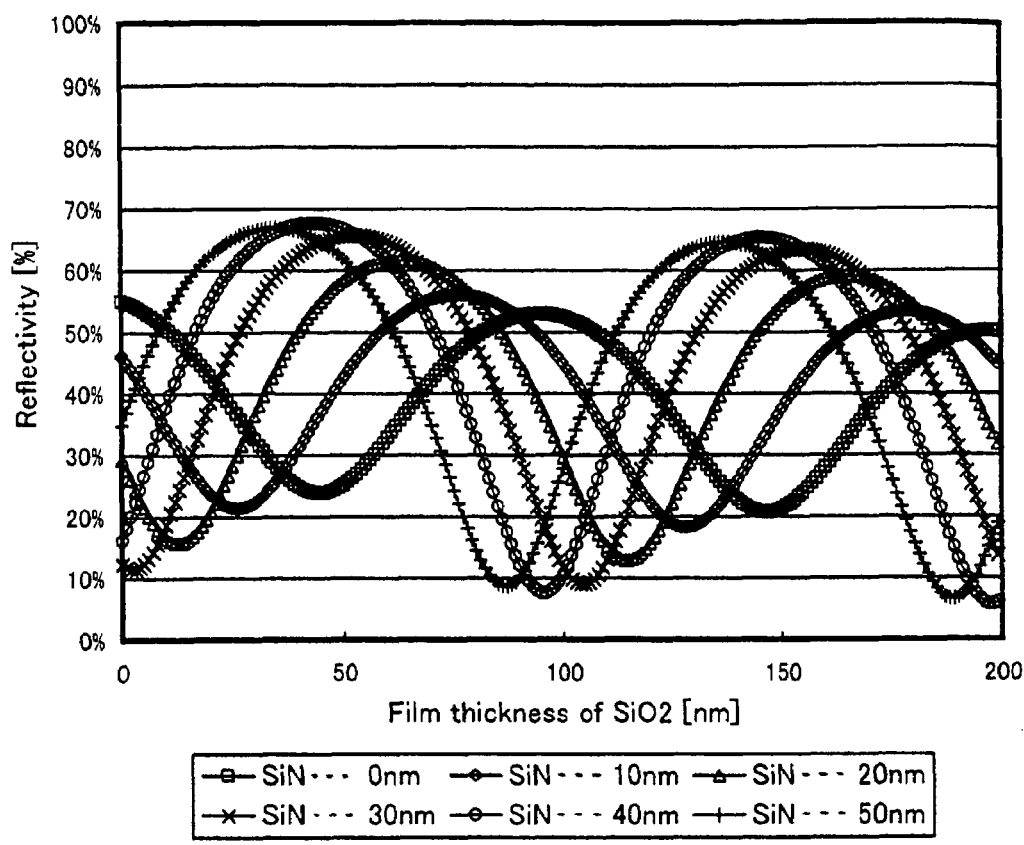
FIG. 3 is a diagram showing the reflectivity of a reflective film.
Figure 3:
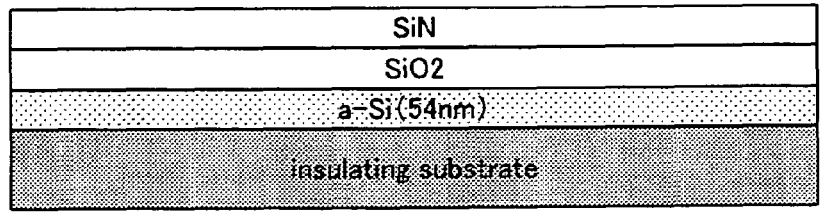

Here, FIG. 3 shows the reflectivity of a reflective film in the case of using light of 308 nm that is a wavelength of an excimer laser (XeCl). FIG. 3 shows results in reflectivity simulations in the case of using a two-layer structure composed of a silicon oxide film and a silicon nitride film stacked on the silicon oxide film for the reflective film and changing the thicknesses of the respective films. From FIG. 3, it is determined that the reflectivity in the case of providing no reflective film (that is, changing the thicknesses of the silicon oxide film and the silicon nitride film to be 0 nm) is approximately 55%. In addition, it is determined that the reflectivity is approximately 68% when the reflective film is formed by stacking the silicon oxide film and the silicon nitride film to be 45 nm and 40 nm respectively. Therefore, it is preferable that a reflective film have a reflectivity of 65% or more when crystallization is performed by excimer laser (XeCl) irradiation.

Although the reflective film has the structure in which the two layers of the silicon oxide film and the silicon nitride film are stacked in FIG. 3, the reflectivity of the reflective film can be expected to be further improved by stacking four layers, six layers, or more layers. In the present embodiment, a structure in which a silicon oxide film and a silicon nitride film are stacked to be 45 nm and 40 nm respectively is used.

Next, as shown in FIG. 1C, patterning of the reflective film 104 is performed to expose a portion of the semiconductor film 103. As a method for patterning, a known patterning technique may be used. However, patterning by dry etching is more preferable. Since the use of dry etching makes it possible to perform anisotropic etching, patterning can be more controlled.

In addition, the width between reflective films (the width of a slit) is controlled to be 1 to 10 μm, preferably 2 to 3 μm.

Next, as shown in FIG. 1D, with the patterned reflective film 104 as a mask, the region 111 is crystallized by laser light irradiation to form a crystalline semiconductor film 105. Although the crystallinity of the region 110 (the semiconductor film not covered with the reflective film) may be also improved depending on the kind of a reflective film or the condition of an irradiated laser light, the crystallinity is inferior to that of the region 111 (the semiconductor film covered with the reflective film). It is to be noted that the crystalline semiconductor film 105 may be formed by adding an element for promoting crystallization of a semiconductor film, such as Ni, with the patterned reflective film 104 as a mask and promoting solid-phase growth before the step of crystallizing the region 111 by laser light irradiation. Further, one or more kinds of elements selected from the group consisting of Fe, Co, Ni, Ru, Rh, Pd, Os, Ir, Pt, Cu, and Au can be used as the element for promoting crystallization of a semiconductor film.

Laser light to be used in the steps is laser light by pulsed oscillation, and any kind of laser light may be used as long as the laser light can be produced by pulsed oscillation. For example, any one of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti:sapphire laser, a copper vapor laser, and a gold vapor laser can be used. In the present embodiment, an eximer layer (XeCl) is used.

In addition, the energy density of a laser beam for irradiation is changed depending on conditions such as the film thickness of the semiconductor film 105, the pulse width and wavelength of the laser beam for irradiation. For example, when a semiconductor film 50 nm in film thickness is crystallized by a XeCl excimer laser, laser irradiation may be performed at an energy density of 400 to 1000 $mJ/cm^2$.

Next, the patterned reflective film 104 is all removed to expose the whole surface of the semiconductor film. As a method for removing the patterned reflective film 104, a known etching technique may be used, and more preferably, the patterned reflective 104 may be removed by wet etching. This is because the use of wet etching makes it possible to increase the etching electivity of the silicon oxide film to be used for the reflective film 104 to the crystalline semiconductor film 105 more as compared with dry etching. Namely, the reflective film 104 can be removed without overetching of the crystallized semiconductor film. In the present embodiment, with the use of a mixed solution (from STELLA CHEMIFA CORPORATION, Product Name: LAL500) 7.13 wt % including ammonium hydrogen fluoride ($NH_4HF_2$) and 15.4 wt % ammonium fluoride ($NH_4F$) as an etchant, the reflective film 104 is etched at room temperature.

Next, after exposing the whole surface of the semiconductor film, the whole area of the exposed semiconductor film is doped with an impurity that imparts p-type conductivity, such as boron. This step makes it possible to perform channel doping for a region to serve as a channel forming region of a TFT so that the threshold voltage of the TFT can be controlled.

Figure 2A:
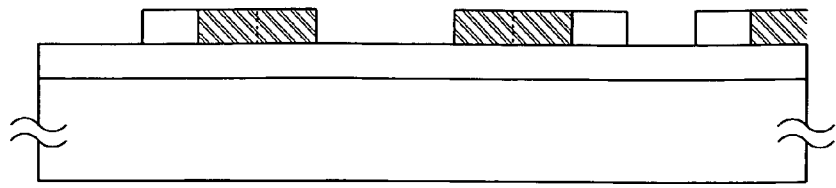
FIGS. 2A to 2E are diagrams illustrating Embodiment 1 of the invention.

Next, as shown in FIG. 2A, patterning of the region 110 is performed. As a method for patterning, a known patterning technique may be used. In addition, all of the region 110 may be subjected to patterning, or a portion thereof may be subjected to patterning. In the present embodiment, only a portion of the region 110 is subjected to patterning while the crystalline semiconductor film 105 is not subjected to patterning.

Figure 2B:
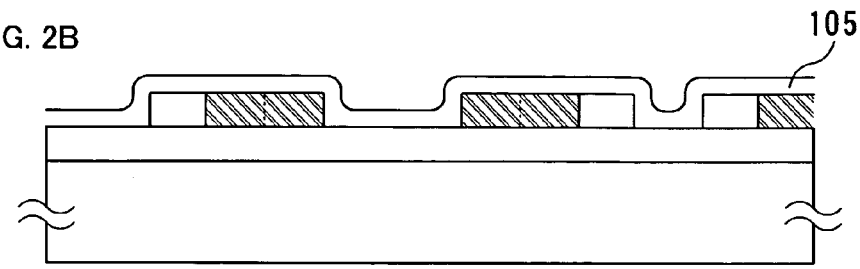

Next, as shown in FIG. 2B, an insulating film (gate insulating film) 106 is formed after patterning of the region 110. The insulating film 106 may have a single-layer structure using any one of a silicon oxide film, a silicon nitride film, a silicon oxynitride film (an SiOxNy film, where x>y, x and y are positive integers), and a silicon oxynitride film (an SiNxOy film, where x>y, x and y are positive integers), or may have a structure in which some of these films are stacked appropriately.

Figure 2C:
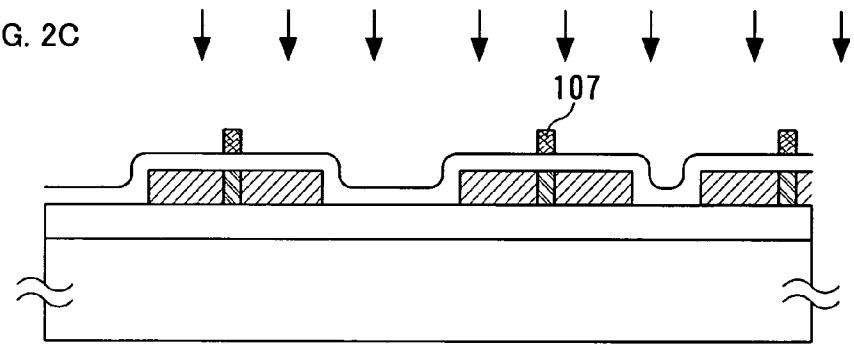

Next, as shown in FIG. 2C, a metal film is formed after forming the insulating film 106, and a portion of the metal film is subjected to patterning to form a gate electrode 107. For the metal film, Al, Mo, W, and the like can be used, and the metal film may have a single-layer structure using the metal, or may have a laminated structure using the metals. For example, a laminated structure in which W is formed on TaN can be used. Alternatively, a polysilicon film may be used instead of the metal film to form the gate electrode 107.

Figure 4A:
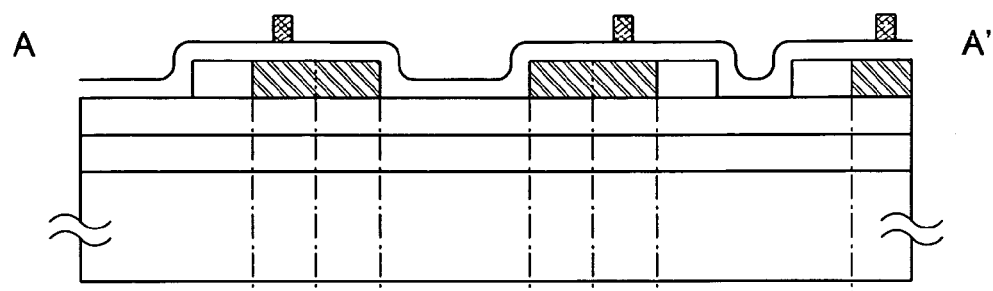
FIGS. 4A and 4B are diagrams illustrating Embodiment 1 of the invention.
Figure 4B:
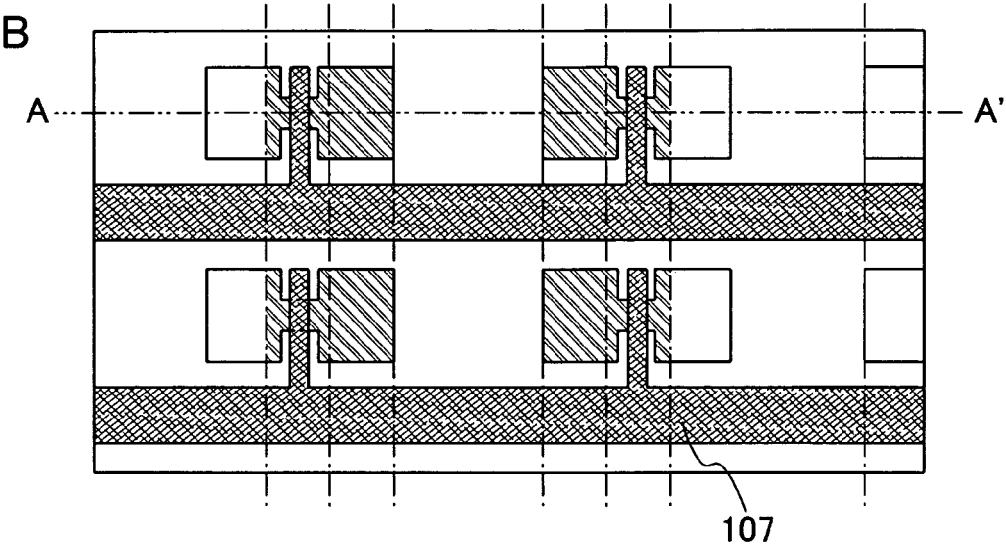

FIGS. 4A and 4B respectively show a cross-sectional view and a top view at the stage of forming the gate electrode 107. The cross-sectional view of FIG. 4A corresponds to the top view of FIG. 4B along the line A-A'. It is preferable that the gate electrode 107 be formed not to include the ridge which exists on a surface of the patterned semiconductor film. More preferably, the gate electrode 107 is formed so that there is only the crystalline semiconductor film 105 with no ridge below a region where the gate electrode 107 is formed by patterning the metal film. Namely, a channel forming region of a TFT, which is to be formed below the gate electrode 107, is formed not to include the ridge. More preferably, a channel forming region of a TFT is formed with the use of the semiconductor film 105 with no ridge.

Figure 5A:
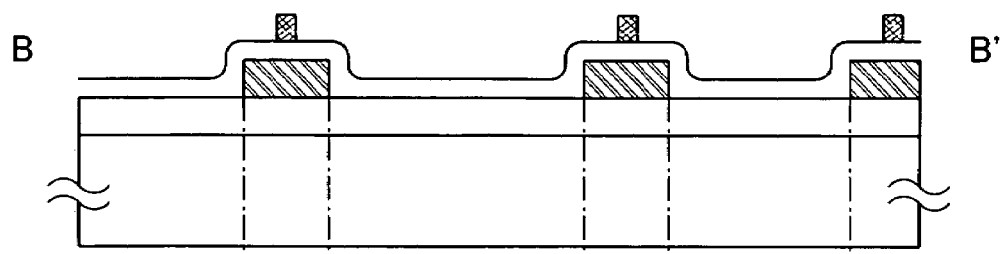
FIGS. 5A and 5B are diagrams illustrating Embodiment 1 of the invention.
Figure 5B:
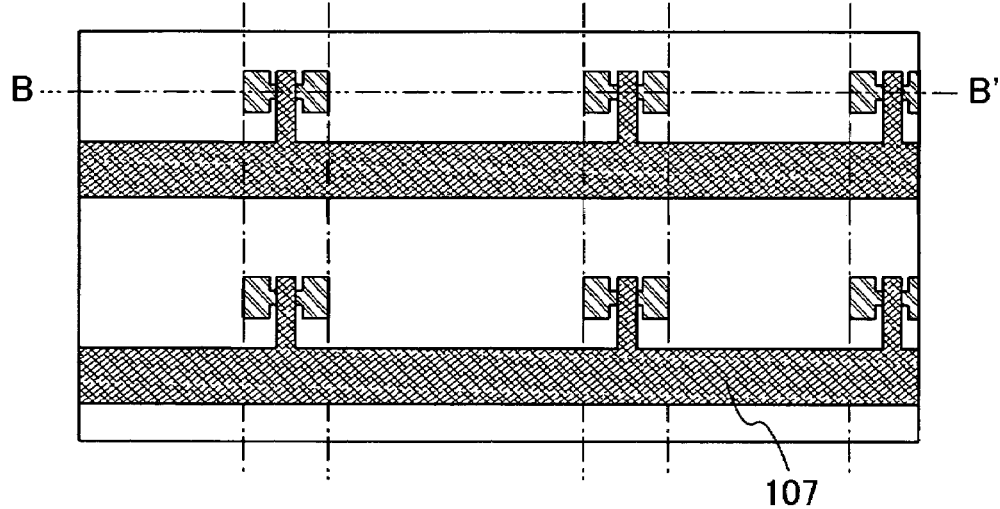

Therefore, as shown in FIGS. 5A and 5B, the crystalline semiconductor film 105 is patterned so as to leave a portion of the region 111, and a gate electrode may be formed over the patterned semiconductor film not to include a ridge. FIGS. 5A and 5B respectively show a cross-sectional view and a top view at the stage of forming the gate electrode 107. The cross-sectional view of FIG. 5A corresponds to the top view of FIG. 5B along the line B-B'. After all, as long as a gate electrode can be formed over the crystalline semiconductor film not to include a ridge, patterning other than FIGS. 4A and 4B and FIGS. 5A and 5B may be performed.

Next, with the gate electrode 107 as a mask, doping with an impurity that imparts n-type conductivity, such as phosphorus, is performed. This process forms a source region and a drain region of a TFT in a self-alignment manner.

Figure 2D:
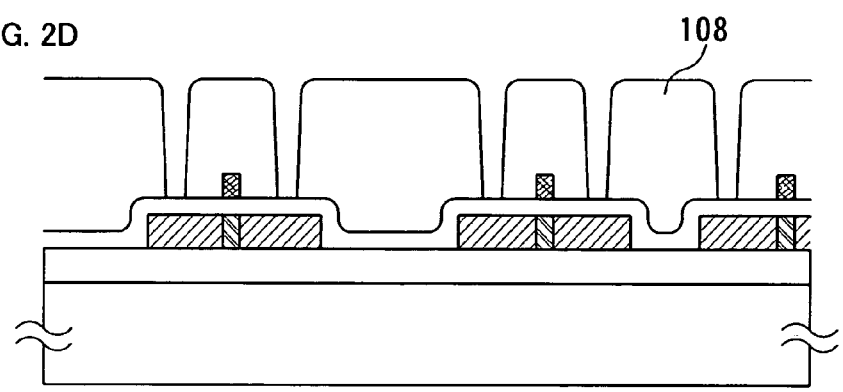

Next, as shown in FIG. 2D, an interlayer insulating film 108 is formed on the insulating film 106 and the gate electrode 107. The interlayer insulating film 108 may have a single-layer structure, or may have a multilayer structure. In addition, as a method for forming the interlayer insulating film 108, materials that have self-flatness (for example, a coating film such as acrylic, polyimide, or siloxane) can be used. In addition, a silicon oxide film, a silicon nitride film, a silicon oxynitride film (an SiOxNy film, where x>y, x and y are positive integers), a silicon oxynitride film (an SiNxOy film, where x>y, x and y are positive integers), and the like can be combined appropriately. In the present embodiment, the interlayer insulating film 108 is formed by stacking an insulating film including an organic resin on an inorganic insulating film. It is to be noted that siloxane has a framework structure composed of a bond of silicon (Si) and oxygen (O), and an organic group including at least hydrogen (for example, an alkyl group or an aromatic hydrocarbon) or a fluoro group may be used as a substituent. Both an organic group including at least hydrogen and a fluoro group may be used as substituents.

Figure 2E:
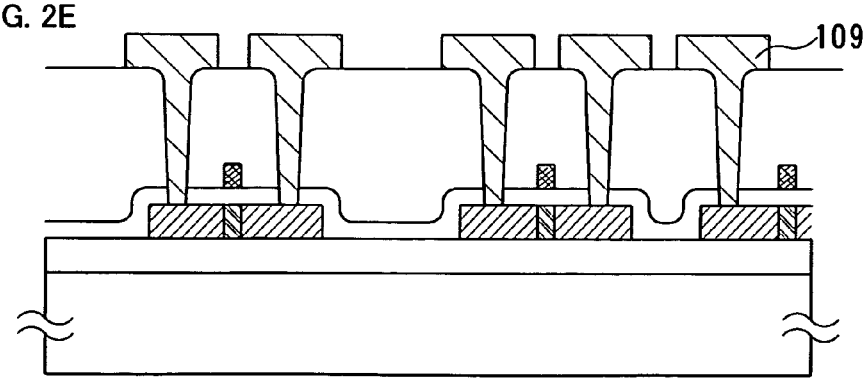

Next, as shown in FIG. 2E, contact holes are formed in the interlayer insulating film 108 so as to reach the source region and drain region of the TFT. The contact holes are preferably shaped to have a tapered shape.

Next, wirings (electrodes) 109 are formed to cover the contact holes. For the wirings 109, Al, Cu, Ag, Ti, Mo, and the like can be used, and the wirings 109 may have a single-layer structure using the metal, or may have a laminated structure using the metals. For example, a structure in which Ti, Al, and Ti are laminated in order or a structure in which Mo, Al, and Mo are laminated in order may be used. In addition, an alloy including Al and C can be also used. This alloy may contain any of elements such as Ni, Co, Fe, and Si. As for the contents of these elements, for example, it is preferable that the content of C be 0.1 to 3.0 atomic %, the content of at least one element of Ni, Co, and Fe be 0.5 to 7.0 atomic %, and Si be 0.5 to 2.0 atomic %.

In accordance with the steps described above, a TFT using a crystalline semiconductor film manufactured according to the present invention for a channel forming region can be manufactured.

The crystalline semiconductor film 105 manufactured in the present embodiment is formed by irradiating the semiconductor film 103 directly with laser light through no other film. When laser irradiation is performed though other film, variations in energy absorbed by the semiconductor film 103 are caused depending on variations in film thickness of the film. When the semiconductor film 103 is directly irradiated with laser light as shown in the present embodiment, energy absorbed by the semiconductor film 103 is constant in the surface the semiconductor film 103. Therefore, the crystalline semiconductor film 105 is used to form channel forming regions for TFTs and manufacture a plurality of TFTs, variations in characteristics of the individual TFTs an be eliminated.

It is to be noted that a p-channel TFT can be manufactured according to the present invention although the process for manufacturing an n-channel TFT is described in the present embodiment.

Embodiment 2

In the present embodiment, a method for manufacturing a crystalline semiconductor film in a different way than Embodiment 1 will be described with reference to FIGS. 6A to 6D.

Figure 6A:
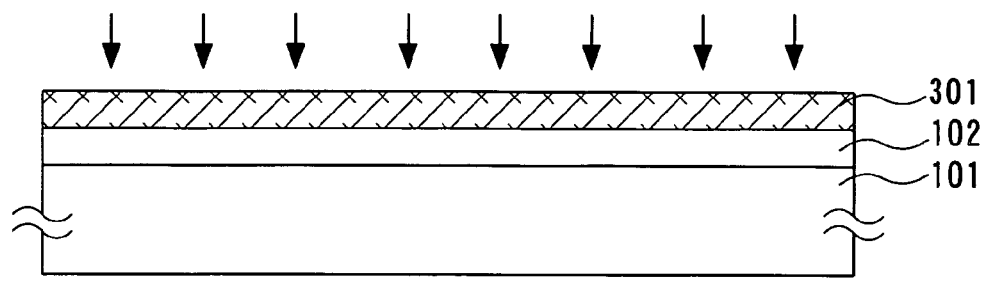
FIGS. 6A to 6D are diagrams illustrating Embodiment 2 of the invention.

First, as shown in FIG. 6A, a base film 102 is formed on an insulating substrate 101 such as a glass substrate or a quartz substrate. As a method for forming the base film 102, a known method such as CVD typified by plasma CVD or low-pressure CVD or sputtering may be used. In addition, The base film 102 may have a single-layer structure using any one of a silicon oxide film, a silicon nitride film, a silicon oxynitride film (an SiOxNy film, where x>y, x and y are positive integers), and a silicon oxynitride film (an SiNxOy film, where x>y, x and y are positive integers), or may have a structure in which some of these films are stacked appropriately. In the present embodiment, a structure in which a silicon oxynitride film (an SiNxOy film, where x>y, x and y are positive integers) and a silicon oxynitride film (an SiOxNy film, where x>y, x and y are positive integers) are stacked is used for the base film 102.

Next, an amorphous semiconductor film 301 is formed on the base film 102.

Next, the amorphous semiconductor film 301 is crystallized to form a crystalline semiconductor film 302.

As a method for crystallization, a known method of crystallizing a semiconductor film by heating with the use of Ni may be used. However, crystallization by laser irradiation is preferable, so an example of laser irradiation will be shown in the present embodiment.

Laser light to be used for crystallization may be pulsed oscillation laser or continuous wave laser.

As laser light that can be produced by pulsed oscillation, an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti:sapphire laser, a copper vapor laser, and a gold vapor laser can be used.

In addition, the energy density of a laser beam for irradiation is changed depending on conditions such as the film thickness of a semiconductor film, the pulse width and wavelength of the laser beam for irradiation. For example, when a semiconductor film 50 nm in film thickness is crystallized by a XeCl excimer laser, laser irradiation may be performed at an energy density of 400 to 1000 $mJ/cm^2$.

For light that can be produced by continuous wave laser, a gas laser or a solid laser can be used. The gas laser includes an Ar laser and a Kr laser. In addition, as the solid laser, for example, a laser using a crystal, such as YAG, $YVO_4$, YLF, $YAlO_3$, $Y_2O_3$, or $GdVO_4$ doped with Cr, Nd, Er, Ho, Ce, Co, Ti, Yb, or Tm, can be used. The fundamental wave of the solid laser is different depending on the substance used for doping, and laser light with a fundamental wave around 1 μm can be obtained. Harmonics with respect to the fundamental wave can be obtained by using a non-linear optical element. Typically, the second harmonic (532 nm) and the third harmonic (355 nm) of a Nd:$YVO_4$ laser (fundamental wave: 1064 nm) can be given as examples. Specifically, laser light emitted from a continuous wave $YVO_4$ laser is converted into a higher harmonic wave laser by a non-linear optical element to obtain laser light with output of 10 W. In addition, there is also another method in which a $YVO_4$ crystal and a non-linear optical element are put in a resonator to emit a higher harmonic wave laser. Then, laser light is preferably shaped by an optical system to be rectangular or elliptic at an irradiation surface, and an object to be processed is irradiated with the shaped laser light. In this case, a power density on the order of 0.01 to 100 $MW/cm^2$ (preferably 0.1 to 10 $MW/cm^2$) is necessary. In addition, laser light irradiation is performed while the insulating substrate 101 is moved relatively with respect to the laser light at a speed on the order of 10 to 2000 cm/sec.

Figure 6B:
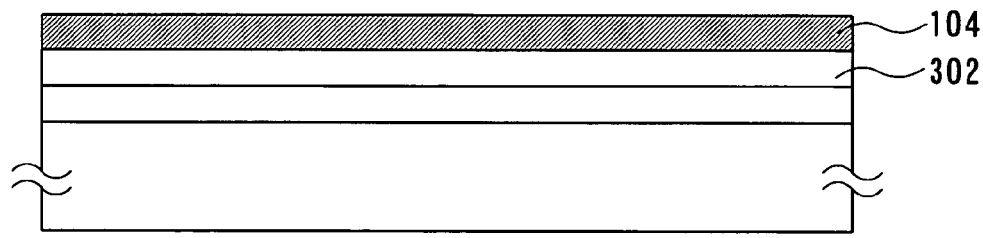

Next, as shown in FIG. 6B, a reflective film 104 is formed on the crystalline semiconductor film 302. For the reflective film 104, a structure in which insulating films are stacked may be used. For example, a structure in which a silicon oxynitride film (an SiOxNy film, where x>y, x and y are positive integers) and a silicon oxynitride film (an SiNxOy film, where x>y, x and y are positive integers) are stacked may be used.

Figure 6C:
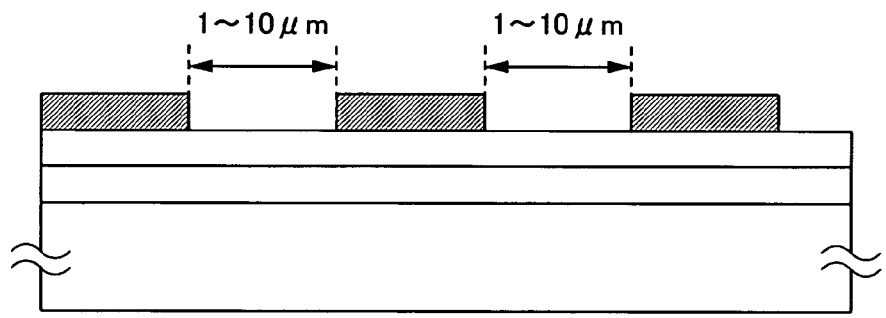

Next, as shown in FIG. 6C, patterning of the reflective film 104 is performed to expose a portion of the crystalline semiconductor 302. As a method for patterning, a known patterning technique may be used. However, patterning by dry etching is more preferable. Since the use of dry etching makes it possible to perform anisotropic etching, patterning can be more controlled.

In addition, the width between adjacent reflective films to each other (the width of a slit) is controlled to be 1 to 10 μm, preferably 2 to 3 μm.

Figure 6D:
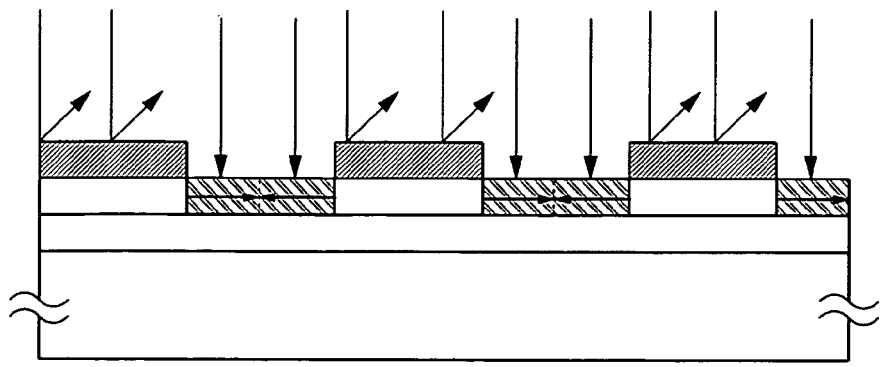

Next, as shown in FIG. 6D, laser light irradiation is again performed with the patterned reflective film as a mask to recrystallize a region of the crystalline semiconductor film 302. In the present embodiment, the amorphous semiconductor film 301 is crystallized in advance, and then, the crystallinity is further improved by laser irradiation in this step. This improvement in the crystallinity is caused by lateral growth due to the orientation of the crystalline semiconductor film 302 obtained by crystallizing the amorphous semiconductor film 301. It is to be noted that laser light is illustrated in FIG. 6D for the sake of simplicity as if laser light is reflected only by the surface of the reflective film 104. However, in fact, laser light also enters the reflective film 104, and is reflected by the boundary surface of each insulating films constituting the reflective film 104. In addition, laser light is reflected also by the interface between the lowest layer of the stacked insulating films constituting the reflective film 104 and the semiconductor film although the reflected ratio itself is small. It is preferable to design the film thickness of each stacked insulating film constituting the reflective film 104 so that at least a portion reflected light that returns to the incidence side is coherent. More preferably, the film thickness of each stacked insulating film constituting the reflective film 104 may be designed so that all reflected light that returns to the incidence side is coherent. In this case, the intensity of reflected light is increased by interference effect.

Laser light to be used in this step is laser light by pulsed oscillation, and any kind of laser light may be used as long as the laser light can be produced by pulsed oscillation. For example, any one of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti:sapphire laser, a copper vapor laser, and a gold vapor laser can be used. In the present embodiment, an eximer layer (XeCl) is used.

In addition, the energy density of a laser beam for irradiation is changed depending on conditions such as the film thickness of a semiconductor film 105, the pulse width and wavelength of the laser beam for irradiation. For example, when a semiconductor film 50 nm in film thickness is crystallized by a XeCl excimer laser, laser irradiation may be performed at an energy density of 400 to 1000 $mJ/cm^2$.

In accordance with the steps described above, a crystalline semiconductor film can be manufactured. The steps up to manufacturing a TFT with the use of a crystalline semiconductor film are omitted here since the method described in Embodiment 1 can be applied.

Embodiment 3

In the present embodiment, an example of applying a crystalline semiconductor film manufactured by the method described in Embodiment 1 or 2 to a display device typified by a liquid crystal display device or an EL display device will be described.

Figure 7A:
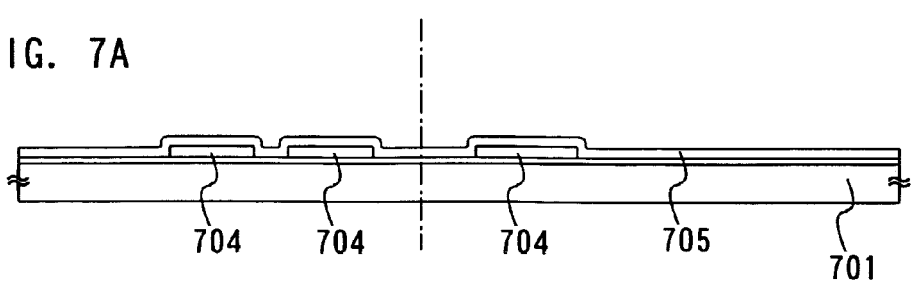
FIGS. 7A to 7E are diagrams illustrating Embodiment 3 of the invention.

As shown in FIG. 7A, after patterning of a crystalline semiconductor film 704 formed over a substrate 701 by crystallizing a semiconductor film by the method described in Embodiment 1 or 2, a gate insulating film 705 is formed. The gate insulating film 705 may have a single-layer structure using any one of a silicon oxide film, a silicon nitride film, a silicon oxynitride film (an SiOxNy film, where x>y, x and y are positive integers), and a silicon oxynitride film (an SiNxOy film, where x>y, x and y are positive integers), or may have a structure in which some of these films are stacked appropriately. In the present embodiment, the gate insulating film has a structure in which a silicon oxynitride film (an SiOxNy film, where x>y, x and y are positive integers) and a silicon oxynitride film (an SiNxOy film, where x>y, x and y are positive integers) are in order stacked. It is to be noted that descriptions of the steps up to forming the crystalline semiconductor film 704 are omitted here, since the method described in Embodiment 1 or 2 can be used.

Figure 7B:
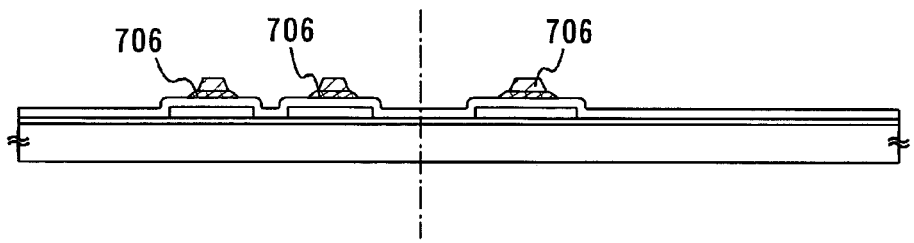

Next, as shown in FIG. 7B, a gate electrode 706 is formed on the gate insulating film 705. As a material for a conductive film to be used as the gate electrode 706, Al, Mo, W, and the like can be used, and the gate electrode 706 may have a single-layer structure using the metal, or may have a laminated structure using the metals. Alternatively, a polysilicon film may be used as the conductive film. In the present embodiment, a structure in which tantalum nitride (TaN) and tungsten (W) are laminated to be 30 nm and 370 nm respectively is used. In this case, it is more preferable that the gate electrode 706 be formed so that the width of TaN is 0.5 to 1.5 µm larger than that of W.

Next, as the gate electrode 706 as a mask, the crystalline semiconductor film 704 is doped with an impurity that imparts p-type conductivity, such as boron (B). This step makes it possible to form a source region and a drain region of a TFT in a self-alignment manner. It is to be noted that a structure without LDD region (lightly doped drain region) may be used although LDD regions are formed by a known doping method between a channel forming region and a source region of a TFT and between the channel forming region and a drain region of the TFT in the present embodiment.

Further, after doping, heat treatment, intense light irradiation, or laser light irradiation may be performed in order to activate the impurity element in the doped impurity regions. This step makes it possible to not only activate the impurity element but also recover plasma damage to the gate insulating film 705 and plasma damage to the interface between the gate insulating film 705 and the semiconductor layer.

Figure 7C:
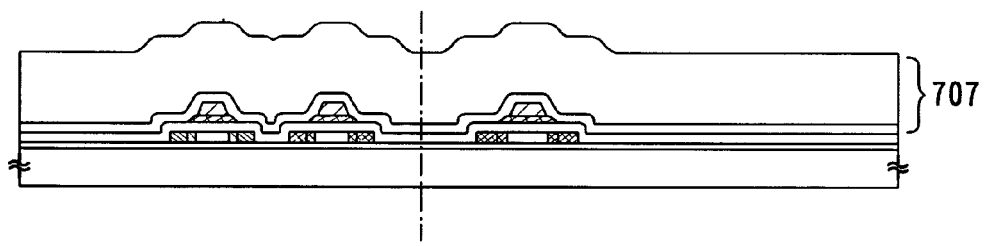

Next, as shown in FIG. 7C, a first interlayer insulating film 707 is formed on the gate insulating film 705 and the gate electrode 706. The first interlayer insulating film 707 may have a single-layer structure using any one of a silicon oxide film (SiOx film), a silicon nitride film (SiNx film), a silicon oxynitride film (an SiOxNy film, where x>y, x and y are positive integers), and a silicon oxynitride film (an SiNxOy film, where x>y, x and y are positive integers), or may have a structure in which some of these films are stacked appropriately may. In the present embodiment, a structure in which a silicon oxynitride film (an SiNxOy film, where x>y, x and y are positive integers) and a silicon oxynitride film (an SiOxNy film, where x>y, x and y are positive integers) are stacked to be 100 nm and 900 nm respectively is used.

After forming the first interlayer insulating film 707, it is preferable to perform a step of performing heat treatment at 300 to 550° C. (more preferably 400 to 500° C.) for 1 to 12 hours in a nitrogen atmosphere to hydrogenate the patterned crystalline semiconductor film (semiconductor layers) 704. This step makes it possible to terminate dangling bonds of the semiconductor layers with hydrogen included in the first interlayer insulating film 707. In the present embodiment, heat treatment is performed at 410° C. for 1 hour.

Figure 7D:
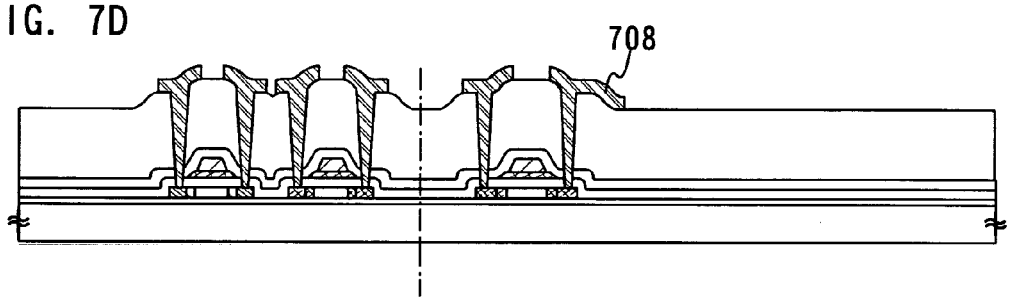

Next, as shown in FIG. 7D, contact holes are formed in the first interlayer insulating film 707 so as to reach the source region and drain region of the TFT. The contact holes are preferably shaped to have a tapered shape.

Next, wirings 708 (electrodes) are formed so as to cover the contact holes. The wirings 708 serve as a source electrode or a drain electrode. The wirings 708 are formed by using a metal such as Ag, Au, Cu, Ni, Pt, Pd, Ir, Rh, W, Al, Ta, Mo, Cd, Zn, Fe, Ti, Si, Ge, Zr, or Ba, an alloy of the metal, or a nitride of the metal. Alternatively, a laminated structure using some of these metals may be used. In the present embodiment, titanium (Ti) is deposited to be 100 nm, an alloy of aluminum and silicon (Al—Si) is deposited to be 700 nm, titanium (Ti) is deposited to be 200 nm, and patterning is performed into a desired shape.

Figure 7E:
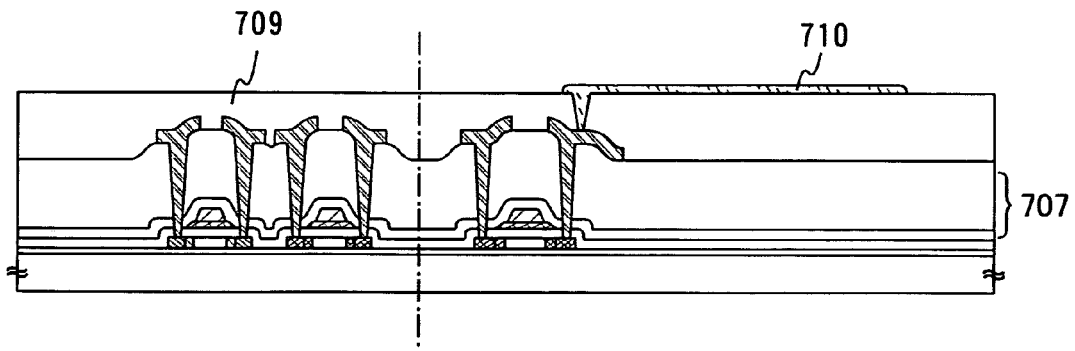

Next, as shown in FIG. 7E, a second interlayer insulating film 709 is formed on the first interlayer insulating film 707 and the wiring 708. The second interlayer insulating film 709 may have a single-layer structure, or may have a multilayer structure. In addition, as a method for forming the second interlayer insulating film 709, materials that have self-flatness (for example, a coating film such as acrylic, polyimide, or siloxane) can be used. In the present embodiment, a coating film including siloxane is baked to form the second interlayer insulating film 709. Although the single-layer structure of siloxane is described as the second interlayer insulating film 709 in the present embodiment, a laminated structure including siloxane in the top layer may be used.

Next, after forming a contact hole in the second interlayer insulating film 709, a first electrode 710 is formed for electrically connecting to the wiring 708 through the contact hole. For the first electrode 710, indium tin oxide including silicon oxide (hereinafter, referred to as "ITSO"), zinc oxide, tin oxide, indium oxide, and the like can be used. In addition, a transparent conductive film, such as an alloy of indium oxide and zinc oxide formed with the use of a target of indium oxide mixed with 2 to 20 wt % zinc oxide (ZnO), can also be used. In addition to the transparent conductive film, a titanium nitride film or a titanium film may be used. In this case, after forming the transparent conductive film, a titanium nitride film or a titanium film is formed to the extent of a film thickness (preferably on the order of 5 to 30 nm) through which light is transmitted. In the present embodiment, an ITSO film 110 nm is formed as the first electrode 710.

Further, polishing may be performed by CMP or wiping with a polyvinyl alcohol porous body so that the first electrode 710 has a planarized surface. After polishing by CMP, ultraviolet irradiation, oxygen plasma treatment, or the like may be performed to the surface of the first electrode 710.

Further, heat treatment may be performed after forming the first electrode 710. Since this heat treatment makes it possible to increase the transmittance of the transparent conductive film, a display device that has high reliability can be manufactured. In the present embodiment, heat treatment is performed at 250° C. for 1 hour.

In the present embodiment, the steps for manufacturing a p-channel TFT are described. However, the present invention can be applied also when an n-channel TFT manufactured by doping the crystalline semiconductor film 704 with an impurity that imparts n-type conductivity with the gate electrode 706 as a mask. Moreover, when a p-channel TFT and an n-channel TFT are manufactured over the same substrate, the invention can be applied.

In addition, the TFT may have a single-gate structure in which one channel forming region is formed, a double-gate structure in which two channel forming regions are formed, or a triple-gate structure in which three channel forming regions are formed. Thin film transistors in a peripheral driver circuit region may also have a single-gate structure, a double-gate structure, or a triple-gate structure.

Moreover, the invention can be applied to methods for manufacturing not only the TFT described in the present embodiment but also a top-gate (planar) TFT, a bottom-gate (inversely staggered) TFT, and a TFT that has a structure in which two gate electrodes are arranged over and below a channel forming region through gate insulating films.

In accordance with the steps described above, a display device typified by a liquid crystal display device or an EL display device that has favorable electrical characteristics can be manufactured with the use of a crystalline semiconductor film manufactured according to the present invention.

Embodiment 4

In the present embodiment, steps up to forming a first electrode without forming the second interlayer insulating film 709 will be described in relation to the display device described in Embodiment 3. Accordingly, repeated descriptions of the same components or components that have the same functions are omitted.

Since steps up to forming the gate electrode 706 are the same as the steps described in Embodiment 3, the subsequent steps will be described in the present embodiment.

Figure 11:
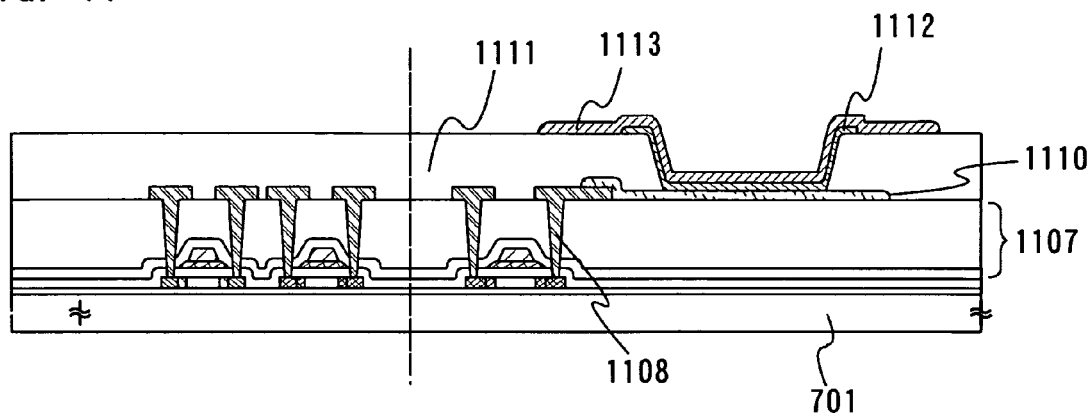
FIG. 11 is a diagram illustrating Embodiment 4 of the invention.

First, as shown in FIG. 11, a first interlayer insulating film 1107 is formed on the gate insulating film 705 and the gate electrode 706. In the present embodiment, a two-layer structure composed of a silicon oxynitride film (an SiNxOy film, where x>y, x and y are positive integers) and a siloxane film is used to form the interlayer insulating film 1107. It is to be noted that a film including silicon oxide, silicon nitride, silicon oxynitride (SiOxNy, where x>y, x and y are positive integers), aluminum oxide, aluminum nitride, aluminum oxynitride (AlOxNy film, where x>y, x and y are positive integers), or other inorganic insulating material may be used instead of the silicon oxynitride film.

Next, contact holes are formed in the first interlayer insulating film 1107 so as to reach a source region and a drain region of a TFT. The contact holes are preferably shaped to have a tapered shape.

Next, wirings 1108 (electrodes) are formed so as to cover the contact holes. The wirings 1108 serve as a source electrode or a drain electrode.

Next, after forming the wirings 1108 connecting the source region or drain region of the semiconductor layer of the TFT, a first electrode 1110 is formed so as to overlap with a portion of the wiring 1108.

The first electrode 1110 serves as a pixel electrode, and the same materials for the first electrode 710 in Embodiment 3 may be used. Also in the present embodiment, an ITSO that is a transparent conductive film is deposited as the first electrode 1110 as in Embodiment 3 so that light is made to pass through the first electrode 1110 and extracted.

Next, an insulating film 1111 is formed to cover edges of the first electrode 1110 and the TFT. The same materials for the second interlayer insulating film 709 described in Embodiment 3 may be used for the insulating film 1111. In the present embodiment, acrylic is used for the insulating film 1111.

Next, a light-emitting element is formed by forming an electroluminescent layer 1112 over the first electrode 1110 and stacking a second electrode 1113 thereon. Then, a passivation film is formed so as to cover the second electrode 1113. Finally, the substrate 701 is bonded to a sealing substrate with a sealing material. It is to be noted that a region surrounded by the sealing material may be filled with a filling material.

Figure 12:
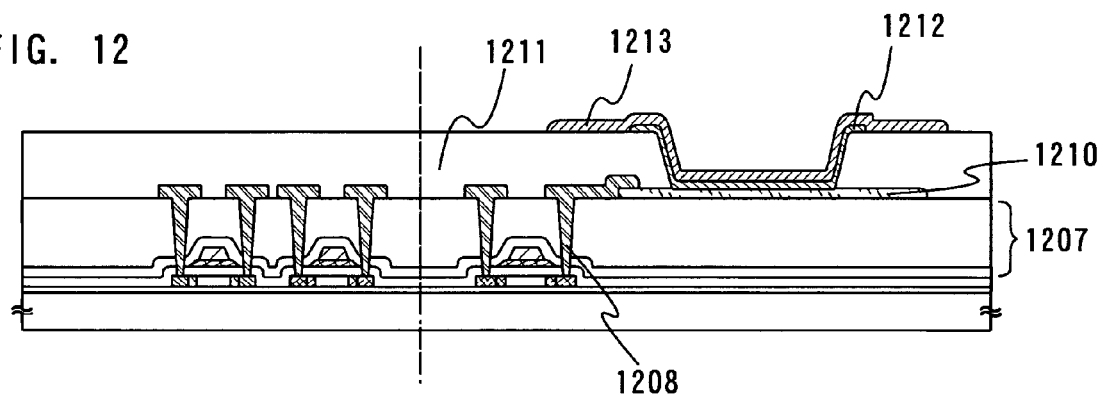
FIG. 12 is a diagram illustrating Embodiment 4 of the invention.

FIG. 12 shows a display device that has a connection structure in which a wiring 1208 is overlapped with a portion of the first electrode 1210. In order to obtain this connection structure, the first electrode 1210 may be formed on a first interlayer insulating film 1207, contact holes may be then formed in the first interlayer insulating film 1207, and the wiring 1208 may be formed so as to overlap with the portion of the first electrode 1210. When the structure is applied, the first electrode 1210 can be formed on siloxane with a favorable coverage. Further, there is an advantage that the first electrode 1210 can be formed with favorable flatness since polishing treatment such as CMP can be performed efficiently to the first electrode 1210.

In accordance with the steps described above, a display device typified by a liquid crystal display device or an EL display device that has favorable electrical characteristics can be manufactured with the use of a crystalline semiconductor film manufactured according to the present invention.

Embodiment 5

In the present embodiment, a method for manufacturing a display device (an EL display device) that has an electroluminescence element (hereinafter, referred to as "an EL element") with the use of a crystalline semiconductor film manufactured by the method described in Embodiment 1 or 2 will be described.

In the present embodiment, a first electrode 810 is formed with the use of a light-transmitting film so that light from the electroluminescence element is extracted from the first electrode 810 side. In the present embodiment, indium tin oxide including silicon oxide (ITSO) is used for the first electrode 810 as in Embodiment 3.

Figure 8:
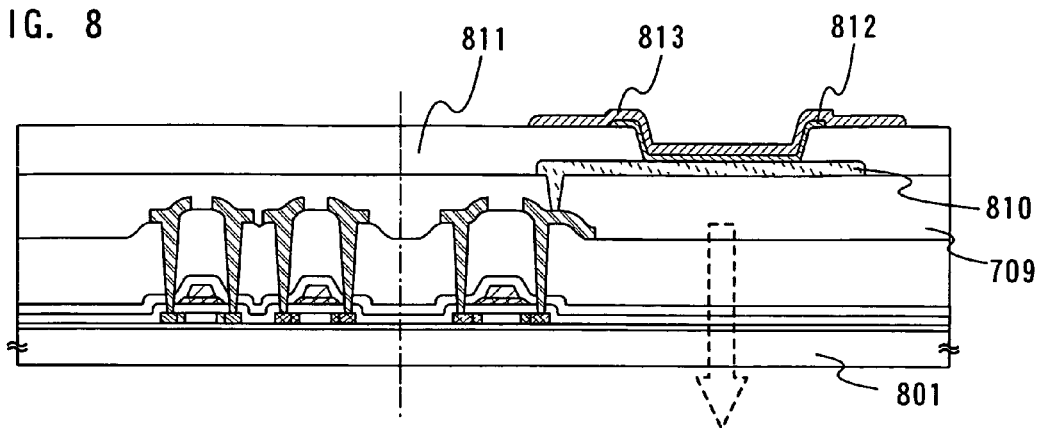
FIG. 8 is a diagram illustrating Embodiment 5 of the invention.

As shown in FIG. 8, an insulating film (referred to as a bank, a partition, a barrier, or the like) 811 is formed so as to cover edges of the first electrode 710 and TFTs.

For the insulating film 811, inorganic insulating materials such as silicon oxide, silicon nitride, silicon oxynitride film (SiOxNy, where x>y, x and y are positive integers), aluminum oxide, aluminum nitride, aluminum oxynitride film (AlOxNy, where x>y, x and y are positive integers), heat-resistant polymers such as an acrylic acid and a derivative thereof, a methacrylic acid and a derivative thereof, polyimide, aromatic polyamide, and polybenzimidazole, and siloxane can be used. In addition, photosensitive or non-photosensitive materials such as acrylic and polyimide can be used for forming the insulating film 811. In the present embodiment, the insulating film 811 is formed with the use of photosensitive polyimide to be 1.5 µm in film thickness in a flat region.

It is preferable that the insulating film 811 have a shape that is varying continuously in curvature radius, and this makes it possible to improve the coverage of an electroluminescent layer (a layer including an organic material) 812 and a second electrode 813 to be formed on the insulating film 811.

In addition, in order to further improve the reliability, heat treatment is preferably performed before forming the electroluminescent layer 812. It is preferable to release moisture included in or adhering to the first electrode 810 and the insulating film 811 by the heat treatment. In the present embodiment, heat treatment is performed 250° C. for 1 hour.

Then, the electroluminescent layer 812 is formed on the first electrode 801. It is to be noted that an electroluminescent layer corresponding to each color of red (R), green (G), and blue (B) is formed in the present embodiment although only one pixel is shown in FIG. 8. In the present embodiment, a material that produces each of red luminescence (R), green luminescence (G), and blue luminescence (B) is selectively deposited by evaporation using an evaporation mask for the electroluminescent layer 812. The material that produces each of red luminescence (R), green luminescence (G), and blue luminescence (B) can be selectively deposited by evaporation using an evaporation mask or droplet discharge. In the case of droplet discharge, there is the advantage of being able to coat the materials for RGB separately without using a mask. In the present embodiment, the material that produces each of red luminescence (R), green luminescence (G) is deposited by evaporation.

Next, the second electrode 813 composed of a conductive film is formed on the electroluminescent layer 812. For the second electrode 813, a material that has a small work function (Al, Ag, Li, Ca, an alloy thereof such as MgAg, MgIn, or AlLi, CaF$_2$, or CaN) may be used. In this way, a light-emitting element composed of the first electrode 810, the electroluminescent layer 812, and the second electrode 813 is formed.

In the display device shown in FIG. 8, light emitted from the light-emitting element is transmitted through films formed between a substrate 801 and the first electrode 810, and emitted from the first electrode 810 side in a direction indicated by an allow.

Further, it is effective to provide a passivation film so as to cover the second electrode 813. The passivation film is an insulating film including silicon nitride, silicon oxide, silicon oxynitride (SiON) in which the content of oxygen is higher than the content of nitrogen, silicon oxynitride (SiNO) in which the content of nitrogen is higher than the content of oxygen, aluminum nitride (AlN), aluminum oxynitride (AlON), aluminum oxynitride (AlNO) in which the content of nitrogen is higher than the content of oxygen, aluminum oxide, diamond-like carbon (DLC), or a carbon film including nitrogen (CN), and a single layer of the insulating film or a lamination layer in combination with the insulating film can be used.

In this case, it is preferable to use a film with favorable coverage as the passivation film, and it is effective to use a carbon film, particularly a DLC film. A DLC film can be formed within the temperature range from room temperature to 100° C., and so can be formed easily also above the electroluminescent layer 812, which is poor in heat resistance. Further, a DLC film has a high blocking effect against oxygen, and so oxidation of the electroluminescent layer 812 can be suppressed. Therefore, it is possible to prevent a problem that the electroluminescent layer 812 is oxidized during a sealing step to be performed subsequently.

Next, the substrate 801 over which the light-emitting element is formed and a sealing substrate are bonded with a sealing material to perform sealing of the light-emitting element. Since penetration of moisture from a section is blocked by the sealing material, degradation of the light-emitting element can be prevented so that the reliability of the display device is improved. Further, a region surrounded by the sealing material may be filled with a filling material, or nitrogen may be filled by sealing in a nitrogen atmosphere. As for the filling material, a filling material in a liquid state may be dropped for filling within the display device. Since the display device is classified in a bottom-emission type in the present embodiment, it is not necessary to use a light-transmitting filling material. However, in the case of a structure in which light is transmitted through a filling material and extracted, it is necessary to produce a filling material by using a light-transmitting material. Examples of filling materials include a visible light curable, ultraviolet curable, and thermosetting epoxy resins. In accordance with the steps described above, a display device that has a light-emitting element is completed.

Further, in order to prevent degradation of the element due to moisture, it is preferable to arrange a desiccant in the EL display panel. In the present embodiment, in order not to prevent the slimness, a desiccant is arranged in a concave portion formed in the sealing substrate so as to surround the pixel region. Further, by arranging a desiccant also on a region corresponding to a gate wiring layer, the area of water absorption can become lager, and the water absorption effect becomes higher. Since the desiccant is formed on the gate wiring layer, which is not directly emit light, the light extraction efficiency is not reduced.

It is to be noted that sealing is a process for protecting the light-emitting element from moisture and that any one of a method of mechanical sealing with a covering material, a method of sealing with a thermosetting resin or an ultraviolet curable resin, and a method of sealing with a thin film that has a high barrier ability such as a metal oxide or a metal nitride is used although a glass substrate is used for sealing of the light-emitting element in the present embodiment. Although glass, ceramics, plastics, and metals can be used as the covering material, it is necessary that the covering material be light-transmitting when light is emitted to the covering material side. In addition, the cover material and the substrate over which the light-emitting element is formed are bonded with a sealing material such as a thermosetting resin or an ultraviolet curable resin, and the rein is cured by heat treatment or ultraviolet irradiation to form an enclosed space. It is also effective to provide an absorbent material typified by barium oxide in this enclosed space. This absorbent material may be provided in contact with the sealing material, or may be provided on the partition or in a peripheral portion not to block light from the light-emitting element. Further, the space between the cover material and the substrate over which the light-emitting element is formed can be filled with a thermosetting resin or an ultraviolet curable resin. In this case, it is effect to add an absorbent material typified by barium oxide in the thermosetting resin or ultraviolet curable resin.

When the present invention is applied, an EL display device using a semiconductor device that has favorable electrical characteristics can be manufactured. Therefore, a high-resolution and high-definition display device can be manufactured at low cost with a favorable yield.

Embodiment 6

It is now clear that an EL display device can be manufactured with the use of a crystalline semiconductor film manufactured according to the present invention. How to emit light emitted from an EL element includes three types of a bottom-emission type, top-emission type, a both-emission type. In Embodiment 5, an example of the bottom-emission type that is an either-emission type. In the present embodiment, examples of the both-emission type and the top-emission type that is an either-emission type will be described with reference to FIGS. 9 and 10, respectively.

Figure 9:
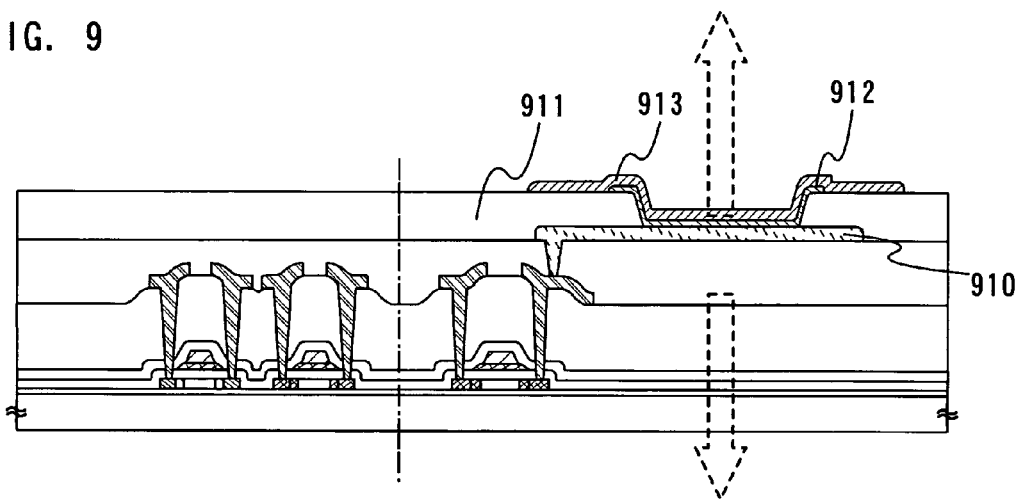
FIG. 9 is a diagram illustrating Embodiment 6 of the invention.

A display device shown in FIG. 9 is classified in the both-emission type, where light is emitted in the directions of arrows from both a substrate side over which a light-emitting element is provided and a sealing substrate. In the present embodiment, a first electrode 910 is formed by forming a transparent conductive film and etching the transparent conductive film into a desired shape. For the first electrode 910, transparent conductive films can be used. In addition to the transparent conductive film, a titanium nitride film or a titanium film may be used. In this case, after forming the transparent conductive film, a titanium nitride film or a titanium film is formed to the extent of a film thickness (preferably on the order of 5 to 30 nm) through which light is transmitted. In the present embodiment, an ITSO film is used as the first electrode 910.

Then, a second electrode 913 of a conductive film is provided on an electroluminescent layer 912. Since the second electrode 913 serves as a cathode, a material that has a small work function (Al, Ag, Li, Ca, an alloy thereof such as MgAg, MgIn, or AlLi, $CaF_2$, or CaN) may be used. In the display device in FIG. 9, a lamination film of a metal thin film (MgAg, film thickness: 10 nm) that is made thinner in film thickness and ITSO (film thickness: 100 nm) that is a transparent conductive film is used as the second electrode 913 so as to transmit light.

Figure 10:
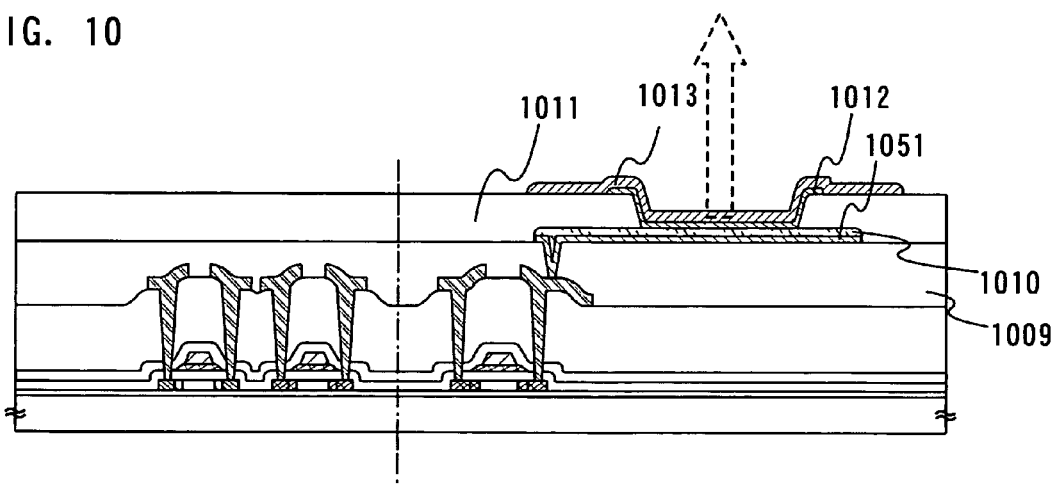
FIG. 10 is a diagram illustrating Embodiment 6 of the invention.

A display device shown in FIG. 10 is classified as an either-emission type, and has a structure in which light is emitted upward in the direction of an arrow. In addition to the structure of the both-emission display device shown in FIG. 9, a reflective film is provided below a first electrode 1010. Namely, as shown in FIG. 10, the first electrode 1010 that is a transparent conductive film to serve as an anode is provided on a reflective metal film 1051. For the reflective metal film 1051, Ta, W, Ti, Mo, Al, Cu, and the like may be used. Particularly, it is preferable to use a material that is highly reflective in the visible region. In the present embodiment, a TiN film is used. In addition, a structure according to the present invention is applied to an insulating film 1009, and display by a light-emitting element has a high resolution without display unevenness since the insulating film 1009 with a favorable insulating property and flatness is formed.

A second electrode 1013 of a conductive film is provided over an electroluminescent layer 1012. Since the second electrode 1013 serves as a cathode, a material that has a small work function (Al, Ag, Li, Ca, an alloy thereof such as MgAg, MgIn, or AlLi, $CaF_2$, or CaN) may be used. In the present embodiment, a laminated structure of a metal thin film (MgAg, film thickness: 10 nm) that is made thinner in film thickness and ITSO (film thickness: 100 nm) is used for the second electrode 1013 so as to transmit light.

Embodiment 7

An embodiment of a light-emitting element (an EL light-emitting element) to which the present invention can be applied will be described. The light-emitting element has a structure in which an electroluminescent layer is interposed between a first electrode and a second electrode. It is necessary to select materials for the first electrode and the second electrode in consideration of the work functions, and the first electrode and the second electrode can be an anode and a cathode respectively or a cathode and an anode respectively depending on the pixel structure.

When a TFT electrically connected to the light-emitting element is a p-channel TFT, it is preferable that the first electrode and the second electrode serve as an anode and cathode respectively. When a TFT electrically connected to the light-emitting element is an n-channel TFT, it is preferable that the first electrode and the second electrode serve as a cathode and an anode respectively.

In addition, when the first electrode and the second electrode serve as an anode and cathode respectively, it is preferable that the electroluminescent layer is formed by stacking an HIL (a hole injecting layer), an HTL (a hole transporting layer), an EML (a light-emitting layer), an ETL (an electron transporting layer), an EIL (an electron injecting layer), and the second electrode (cathode) in this order on the first electrode (anode).

When the first electrode and the second electrode serve as a cathode and an anode respectively, it is preferable that the electroluminescent layer is formed by stacking an EIL (an electron injecting layer), an ETL (an electron transporting layer), an EML (a light-emitting layer), an HTL (a hole transporting layer), an HIL (a hole injecting layer), and the second electrode (anode) in this order on the first electrode (cathode).

The light-emitting layer may have a structure in which a light-emitting layer that shows a different emission wavelength band is formed on a pixel to pixel basis for color display. Typically, a light-emitting layer corresponding to each color of R (red), G (green), and B (blue) is formed. Also in this case, a filter through which light of the emission wavelength band is transmitted is provided on the side to which light is emitted in a pixel so that the color purity can be improved and that the pixel portion can be prevented from being a mirror surface (reflecting). When the filter is provided, a circular polarization plate to be required conventionally and the like can be omitted so that loss of light emitted from the light-emitting layer can be eliminated. Further, variations in color tone can be reduced in the case of viewing the pixel portion (display screen) obliquely.

For the light-emitting layer, a material that produces each of red luminescence (R), green luminescence (G), and blue luminescence (B) is selectively deposited by evaporation using an evaporation mask. The material that produces each of red luminescence (R), green luminescence (G), and blue luminescence (B) can be formed also by droplet discharge as in the case of color filters (for example, in the case of low molecular weight materials or polymers), and this case is preferable since the materials for RGB can be coated separately without using a mask.

In addition, the light-emitting layer can have a composition for producing luminescence of a single color or a white color. When a white luminescent material is used, a filter (a coloring layer) through which light of a specific wavelength is transmitted is provided on the side to which light is emitted in a pixel so that color display is enabled.

Alternatively, a color filter (a coloring layer) may be formed on a sealing substrate. The color filter can be formed by evaporation or droplet discharge, and high-definition display can also be performed when the color filter is used. This is because the color filter makes it possible to correct a broad peak in an emission spectrum for each of RGB to be sharp.

A case of depositing a material that produces each of RGB is described above. However, full color display can be performed by depositing a material that produces monochromatic luminescence and combining a color filter or a color conversion layer. The color filter or the color conversion may be formed on a second substrate (sealing substrate), and then the second substrate may be bonded to a substrate over which a light-emitting element is formed. The color filter can be formed by evaporation or droplet discharge. Since the use of the color filter makes it possible correct a broad peak in an emission spectrum for each of RGB to be sharp, high-definition display can be performed.

For the light-emitting layer, triplet-excitation luminescent materials such as metal complexes may be used in addition to singlet-excitation luminescent materials. For example, of a red light-emitting pixel, a green light-emitting pixel, and a blue light-emitting pixel, the red light-emitting pixel, which produces a luminance with a relatively short half life, is formed with the use of a triplet-excitation luminescent material while the others are formed with the use of singlet-excitation luminescent materials. Since triplet-excitation luminescent materials are excellent in luminous efficiency, it is a feature that lower power consumption is necessary to obtain the same luminance. Namely, when a triplet-excitation luminescent material is applied to the red pixel, the necessary amount of the current applied to a light-emitting element is lower so that the reliability can be improved. In order to lower power consumption, the red light-emitting pixel and the green light-emitting pixel may be formed with the use of triplet-excitation luminescent materials while the blue light-emitting pixel is formed with the use of a singlet-excitation luminescent material. Also as for a green light-emitting element for which people have higher visibility acuity, the power consumption can be lowered by forming the green light-emitting element with the use of a triplet-excitation luminescent material.

The above-described materials for forming a light-emitting layer are just example. A light-emitting element can be formed by appropriately stacking respective functional layers such as a hole injecting layer, a hole transporting layer, an electron injecting layer, an electron transporting layer, a light-emitting layer, an electron blocking layer, and a hole blocking layer. Alternatively, a mixed layer or mixed junction layer in which some of these respective layers are combined may be formed. The structure of the electroluminescent layer can be changed, and modifications can be permitted unless such changes and modifications depart from the scope of the present invention. For example, instead of providing a specific electron injecting region or light-emitting region, an electrode can be provided mainly for these purpose, and a luminescent material can be provided by dispersing the luminescent material.

When the light-emitting element is biased in a forward direction, light is emitted. Pixels of a display device formed with the use of the light-emitting element can be driven by a simple matrix method or an active matrix method. In any case, a forward bias is applied to each pixel at a specific timing to emit light while the pixel is in a non-emitting state for a certain period. When the backward bias is applied for this non-emitting time, the reliability of the light-emitting element can be improved. In addition, any of digital driving and analog driving can be applied.

In addition, in the structure described above, a material that has a small work function can be used for the cathode, and for example, materials such as Ca, Al, CaF, MgAg, and AlLi are preferable. The electroluminescent layer may have any of a sing-layer structure, a laminated structure, and a mixed-layer structure in which there is no interface between layers. For example, the electroluminescent layer may have a laminated structure in which layers such as a hole injecting layer, a hole transporting layer, a hole blocking layer, a light-emitting layer, an electron transporting layer, and an electron injecting layer are appropriately combined. In addition, materials for forming the electroluminescent layer include not only a material composed of only an organic compound but also a material including an inorganic compound as a part thereof, and these materials may be any of low molecular weight compound, middle molecular weight compounds (including oligomers and dendrimers), and polymers. Further, as a method for forming the electroluminescent layer, an evaporation method using an evaporation mask, inkjet, spin coating, or the like can be used. The first electrode is formed with the use of a light-transmitting transparent conductive film, for example, a transparent conductive film formed with the use of a target of, ITO, ITSO, indium oxide mixed with 2 to 20 wt % zinc oxide (ZnO).

When the present invention is applied, an EL display device using a semiconductor device that has favorable electrical characteristics can be manufactured. Therefore, a high-resolution and high-definition display device can be manufactured at low cost with a favorable yield.

The present embodiment can be used appropriately in combination with the embodiment mode and Embodiments 1 to 6.

Embodiment 8

In the present embodiment, the appearance of a liquid crystal display device panel corresponding to an example of a semiconductor device according to the present invention will be described with reference to FIGS. 13A and 13B. FIG. 13A is a top view of the panel in which the first substrate 1600 and the second substrate 1604 are bonded with the fist sealing material 1605 and the second sealing material 1606, and a region between the first substrate 1600 and the second substrate 1604 is filled with a liquid crystal material. Each of the first and second sealing materials 1605, 1606 include a gap material for keeping an enclosed space (spacing). FIG. 13B corresponds to a cross-sectional view of FIG. 13A along the line A-A'.

In FIG. 13A, portions 1602 and 1603 indicated by dashed lines are a pixel portion and a scanning line (gate line) driver circuit, respectively. In the present embodiment, the pixel portion 1602 and the scanning line driver circuit 1603 are provided within a region surrounded by the sealing material 1605 and the sealing material 1606. In addition, reference numeral 1601 denotes a signal line (source line) driver circuit, and the chip-shaped signal line driver circuit is provided over the first substrate 1600. Each of the signal line driver circuit 1601, the pixel portion 1602, and the scan line driver circuit 1603 has a plurality of semiconductor elements typified by a TFT.

Next, the structure of a section will be described with reference to FIG. 13B. The signal line driver circuit 1601, the pixel portion 1602, and the scan line driver circuit 1603 are formed over the first substrate 1600. In addition, a color filter (not shown) is provided on the surface of the second substrate 1604. In the cross-sectional view, the scan line driver circuit 1603 and the pixel portion 1602 are shown. It is to be noted that a CMOS circuit may be formed by a combination of an n-channel TFT 1612 and a p-channel TFT 1613 in the scan line driver circuit 1603, or only one type of an n-channel TFT and a p-channel TFT may be formed to form the scan line driver circuit 1603.

In the present embodiment, the TFTs of the scanning line driver circuit and the TFTs of the pixel portion are formed over the same substrate. Therefore, the volume of the display device can be reduced.

The pixel portion 1601 has a plurality of pixels formed, and a liquid crystal element 1615 is formed in each pixel. The liquid crystal element 1615 is a portion where a first electrode 1616, a second electrode 1618, and a liquid crystal material 1619 provided therebetween are overlapped with each other. The first electrode 1616 of the liquid crystal element 1615 is electrically connected to a TFT 1611 through a wiring 1617. Although the first electrode 1616 is formed after forming the wiring 1617 here, the wiring 1617 may be formed after forming the first electrode 1616 as shown in Embodiment 1. The second electrode 1618 of the liquid crystal element 1615 is formed on the second substrate 1604 side. In addition, orientation films (not shown) are formed on the surfaces of each pixel electrode.

Reference numeral 1622 denotes a columnar spacer provided for controlling the distance (cell gap) between the first electrode 1616 and the second electrode 1618, which is formed by etching of an insulating film into a desired shape. It is to be noted that a spherical spacer may be used instead. Various signals and potentials to be provided to the signal line driver circuit 1601 or the pixel portion 1602 are supplied from an FPC 1609 through a connection wiring 1623. It is to be noted that the connection wiring 1623 is electrically connected to the FPC 1609 through an anisotropic conductive film or anisotropic conductive resin 1627. It is to be noted that a conductive paste such as soldering may be used instead of the anisotropic conductive film or anisotropic conductive resin 1627.

On the surface of the second substrate 1604, a polarization plate 1625 is fixed with an adhesive material 1624. It is to be noted that a circular polarization plate or elliptical polarization plate with a retardation film may be used as the polarization plate 1625. Further, a ½λ or ¼λ retardation film 1629 and an antireflection film 1626 are provided on the surface of the polarization plate 1625. In addition, also on the surface of the first substrate 1600, a polarization plate is fixed with an adhesive material as well.

Embodiment 9

Figure 14A:
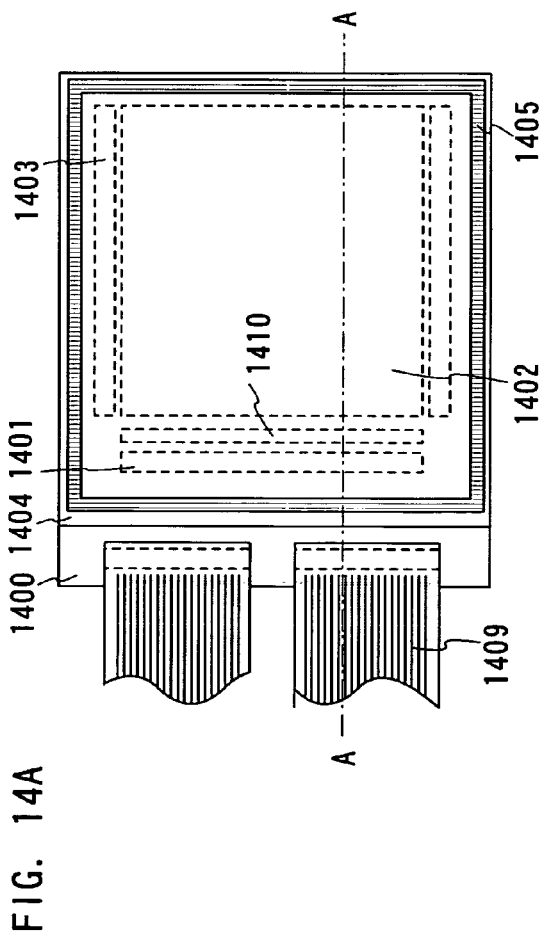
FIGS. 14A and 14B are diagrams illustrating Embodiment 9 of the invention.
Figure 14B:
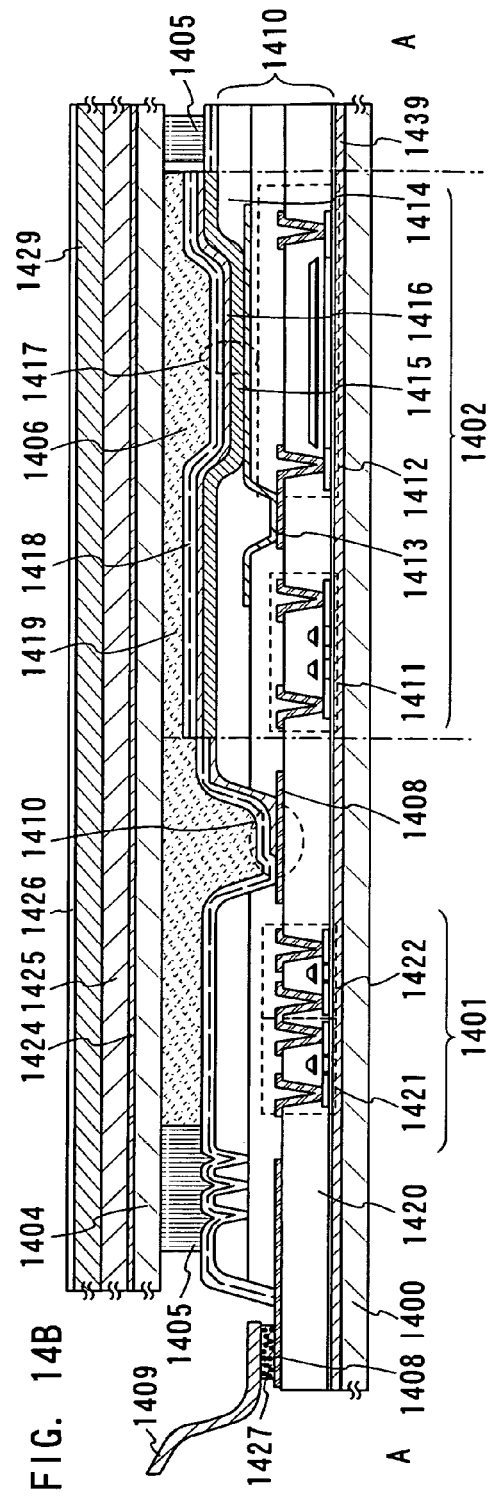

In the present embodiment, the appearance of an EL display device panel corresponding to an example of a semiconductor device according to the present invention will be described with reference to FIGS. 14A and 14B. FIG. 14A is a top view of the panel in which a first substrate 1400 and a second substrate 1404 are bonded with a first sealing material 1405 and a second sealing material 1406, and FIG. 14B corresponds to a cross-sectional view of FIG. 14A along the line A-A'.

In FIG. 14A, portions 1402 and 1403 indicated by dashed lines are a pixel portion and a scan line (gate line) driver circuit, respectively. In the present embodiment, the pixel portion 1402 and the scan line driver circuit 1403 are provided within a region surrounded by the sealing material 1405 and the sealing material 1406. In addition, reference numeral 1401 denotes a signal line (source line) driver circuit, and the chip-shaped signal line driver circuit 1401 is provided over the first substrate 1400. It is preferable to use a more viscous epoxy resin including a filler for the first sealing material 1405, and to use a less viscous epoxy resin for the second sealing material 1406. In addition, it is desirable to use a material that hardly allows permeation of moisture or oxygen for each of the first sealing material 1405 and the second sealing material 1406. Each of the signal line driver circuit 1401, the pixel portion 1402, and the scan line driver circuit 1403 has a plurality of semiconductor elements typified by a TFT.

Besides, a desiccant may be provided between the pixel portion 1402 and the sealing material 1405. Further, in the pixel portion 1402, a desiccant may be provided on a scan lime or a signal line. As the desiccant, it is preferable to use a material that adsorbs water ($H_2O$) by chemical adsorption, for example, an oxide of an alkali-earth metal such as calcium oxide (CaO) or barium oxide (BaO). However, the desiccant is not limited to these materials, and a material that adsorbs water by physical adsorption, for example, zeolite or silica gel, may be used.

Alternatively, a highly moisture-permeable resin including a granular substance that is a desiccant can be fixed to the second substrate 1404. Instead of the highly moisture-permeable resin, siloxane, polyimide, PSG (phosphosilicate glass), BPSG (borophosphosilicate glass), or the like may be used.

In addition, a desiccant may be provided in a region overlapping with a scan line, and further, a highly moisture-permeable resin including a granular substance that is a desiccant may be fixed to the second substrate 1404. By providing these desiccants, penetration of moisture into a display element and degradation caused by the penetration can be suppressed without reducing the aperture ratio. Thus, it is possible to suppress variations in degradation of light-emitting elements on the periphery of and in the central area of the pixel portion 1402.

It is to be noted that reference numeral 1410 denotes a connecting region for transmitting signals to be input to the signal line driver circuit 1401 and the scan line driver circuit

1403, which receives video signals and clock signals from a flexible printed circuit (FPC) 1409 to serve as an external input terminal through a connection wiring 1408.

Next, the structure of a section will be described with reference to FIG. 14B. The signal line driver circuit 1401, the pixel portion 1402, and the scan line driver circuit 1403 are formed over the first substrate 1400. In the cross-sectional view, the signal line driver circuit 1401 and the pixel portion 1402 are shown. It is to be noted that a CMOS circuit is formed by a combination of an n-channel TFT 1421 and a p-channel TFT 1422 in the signal line driver circuit 1401.

In the present embodiment, the TFTs of the scanning line driver circuit and the TFTs of the pixel portion are formed over the same substrate. Therefore, the volume of the display device can be reduced.

Besides, the pixel portion 1402 has a plurality of pixels, each of which includes a switching TFT 1411, a driving TFT 1412, a first pixel electrode (anode) 1413 composed of a light-transmitting conductive film electrically connected to a drain (or a source) of the driving TFT 1412. It is to be noted that the switching TFT 1411 is a TFT provided for selecting whether or not to input a signal into a pixel and the driving TFT 1412 is a TFT provided for driving a light-emitting element.

Further, an insulator (referred to as a bank, a partition, or a barrier) 1414 is formed on both ends of the first pixel electrode (anode) 1413. In order for a film forming the insulator 1414 to have a favorable coverage, a top portion or bottom portion of the insulator 1414 is formed to have a curved surface with a curvature. In addition, the surface of the insulator 1414 may be covered with a protective film such as an aluminum nitride film, an aluminum oxynitride film, a thin film including carbon as its main component, or a silicon nitride film. Further, when an organic material in which a material that absorbs visible light such as a black pigment or a dye is dissolved or dispersed is used for the insulator 1414, stray light from a light-emitting element to be formed later can be absorbed. In the result, the contrast of each pixel is improved.

In addition, evaporation of an organic compound material is performed to form an electroluminescent layer 1415 selectively over the first pixel electrode (anode) 1413. Further, a second pixel electrode (cathode) 1416 is formed over the electroluminescent layer 1415.

In this way, a light-emitting element 1417 composed of the first pixel electrode (anode) 1413, the electroluminescent layer 1415, and the second pixel electrode (cathode) 1416 is formed. In the present embodiment, luminescence from the light-emitting element 1417 is emitted to the first substrate 1400 side. However, without limitation to this structure, luminescence from the light-emitting element 1417 may be emitted to the second substrate 1404 side or may be emitted from both the first substrate 1400 and the second substrate 1404 sides.

Further, for sealing of the light-emitting element 1417, a protective lamination layer 1418 is formed. The protective lamination layer 1418 is composed of a lamination layer of a first inorganic insulating film, a stress relaxation film, and a second inorganic insulating film. Then, the protective lamination layer 1418 and the second substrate 1404 are bonded with the first sealing material 1405 and the second sealing material 1406. It is to be noted that it is preferable to drop the second sealing material 1406 by a system for dropping a sealing material. Sealing can be performed in such a way that a sealing material is dropped or discharged from a dispenser to apply the sealing material on an active matrix substrate, then, a second substrate and the active matrix substrate are boned in vacuum, and ultraviolet curing is performed.

Further, an antireflection film 1426 for preventing outside light from being reflected by the surface of the substrate is provided over the surface of the second substrate 1404. In addition, one or both of a polarization plate 1425 and a retardation plate 1429 may be provided between the second substrate 1404 and the antireflection film 1426. By providing a polarization plate or a retardation film, it is possible to prevent outside light from being reflected by the pixel electrodes. It is to be noted that when each of the first pixel electrode 1413 and the second pixel electrode 1416 is formed by using a light-transmitting conductive film or a translucent conductive film, and the insulator 1414 is formed by using a material that absorbs visible light or an organic material in which a material that absorbs visible light is dissolved or dispersed, it is not necessary to use a retardation film or a polarization plate since outside light is not reflected by each pixel electrode.

The connection wiring 1408 and the flexible printed circuit 1409 are electrically connected to each other by an anisotropic conductive film or an isotropic conductive resin 1427. Further, it is preferable that a portion for connecting each wiring layer and a connection terminal is subjected to sealing with a sealing resin. This sealing makes it possible to prevent penetration of moisture from the section of the EL display panel.

It is to be noted that there may be a space filled with an inert gas, for example, a nitrogen gas, instead of the second sealing material 1406, between the second substrate 1404 and the protective lamination layer 1418. Penetration of moisture or oxygen can be more prevented.

Further, a coloring layer can be provided between the second substrate 1404 and the polarization plate 1425. In this case, full-color display is possible by providing light-emitting elements that are capable of emitting white light in the pixel portion 1402 and separately providing coloring layers for displaying RGB. Alternatively, full-color display is possible by light-emitting elements that are capable of emitting blue light in the pixel portion 1402 and separately providing color conversion layers or the like. Further alternatively, it is possible to form light-emitting elements that emit red, green, or blue light in the pixel portion 1402 and use coloring layers. In the case of such a display module, each of RGB is high in color purity, and high-resolution display is possible.

In addition, a light-emitting display module may be formed with the use of a substrate such as a film or a resin for one or both of the first substrate 1400 and the second substrate 1404. When sealing is performed without using an opposed substrate in this way, the display device can be made lighter, smaller, and slimmer.

Further, for forming a light-emitting display module, an IC chip such as a controller, a memory, or a pixel driver circuit may be provided on the surface or at an edge of the flexible printed circuit (FPC) 1409 to serve as an external input terminal.

Embodiment 10

Electric devices manufactured according to the present invention include a video camera, a digital camera, a goggle-type display (head mount display), a navigation system, a sound reproduction device (such as an in-car audio system or an audio set), a personal computer, a game machine, a personal digital assistant (such as a mobile computer, a cellular phone, a portable game machine, or an electronic book), an image reproduction device equipped with a recording medium (specifically, a device equipped with a display device, which can reproduce a recording medium such as a DVD (digital versatile disc) and display the image), and another electric appliance that has a display portion. When a crystalline semiconductor film formed by a laser irradiation method according to the present invention is used, an integrated circuit required to have quite high characteristics, typified by a CPU or a memory, can be manufactured. Specific examples of the electric devices will be described with reference to FIGS. 15A to 15H.

Figure 15A:
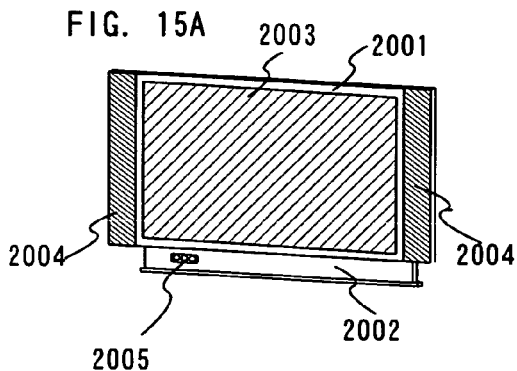
FIGS. 15A to 15H are diagrams Embodiment 10 of the invention.

FIG. 15A is a television set, which includes a frame body 2001, a support 2002, a display portion 2003, a speaker portion 2004, and a video input terminal 2005. The television set can be manufactured by using a semiconductor device that has high electrical characteristics obtained by laser light irradiation as shown in the present invention for the display portion 2003 and the like.

Figure 15B:
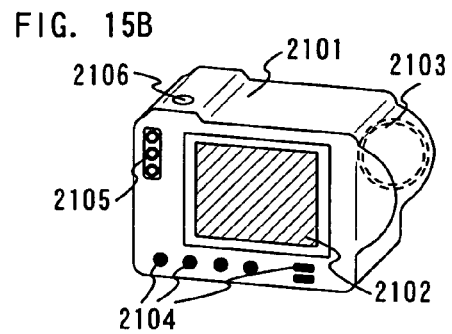

FIG. 15B is a digital camera, which includes a main body 2101, a display portion 2102, an image receiving portion 2103, an operation key 2104, an external connection port 2105, and a shutter 2106. The digital camera can be manufactured by using a semiconductor device that has high electrical characteristics obtained by laser light irradiation as shown in the present invention for the display portion 2102, other circuit, and the like.

Figure 15C:
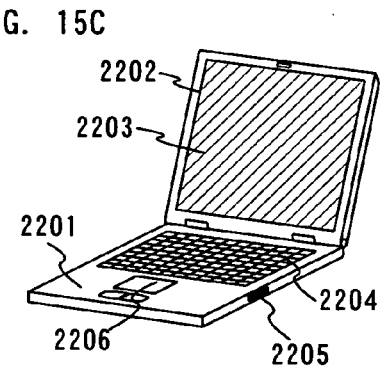

FIG. 15C is a personal computer, which includes a main body 2201, a frame body 2202, a display portion 2203, a keyboard 2204, an external connection port 2205, and pointing mouse 2206. The computer can be manufactured by using a semiconductor device that has high electrical characteristics obtained by laser light irradiation as shown in the present invention for the display portion 2203, other circuit, and the like.

Figure 15D:
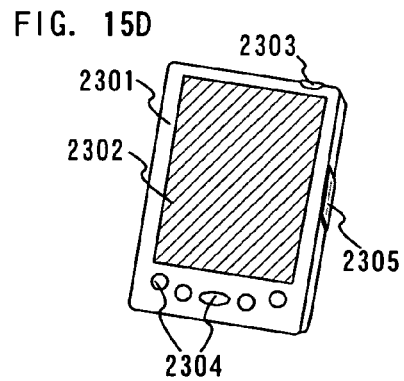

FIG. 15D is a mobile computer, which includes a main body 2301, a display portion 2302, a switch 2303, an operation key 2304, and an infrared port 2305. The mobile computer can be manufactured by using a semiconductor device that has high electrical characteristics obtained by laser light irradiation as shown in the present invention for the display portion 2302, other circuit, and the like.

Figure 15E:
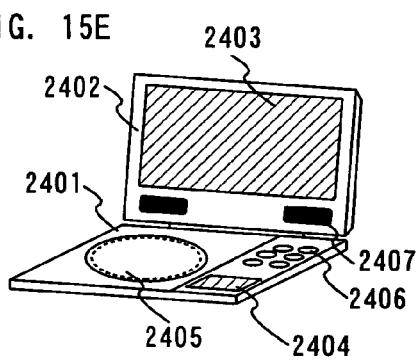

FIG. 15E is a portable image reproduction device equipped with a recording medium (such as a DVD reproduction device), which includes a main body 2401, a frame body 2402, a display portion A 2403, a display portion B 2404, a recording medium (such as a DVD) reading portion 2405, an operation key 2406, and a speaker portion 2407. The display portion A 2403 is used mainly for displaying image information, and the display portion B 2404 is used mainly for displaying textual information. The image reproduction device can be manufactured by using a semiconductor device that has high electrical characteristics obtained by laser light irradiation as shown in the present invention for the display portion A 2403, the display portion A 2404, other circuit, and the like. It is to be noted that the mage reproduction device equipped with a recording medium also includes a game machine.

Figure 15F:
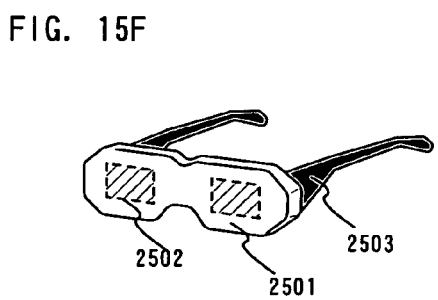

FIG. 15F is a goggle-type display (head mount display), which includes a main body 2501, a display portion 2502, and an arm portion 2503. The goggle-type display can be manufactured by using a semiconductor device that has high electrical characteristics obtained by laser light irradiation as shown in the present invention for the display portion 2502, other circuit, and the like.

Figure 15G:
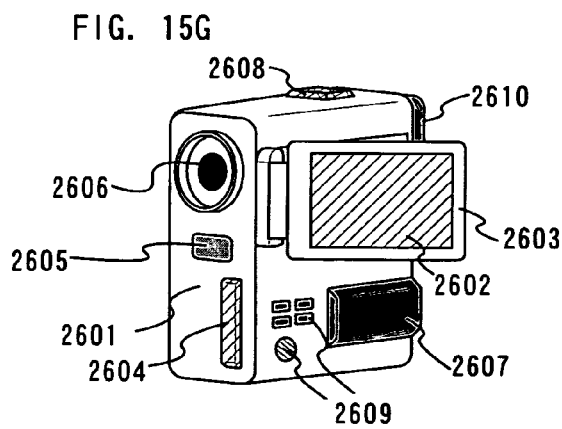

FIG. 15G is a video camera, which includes a main body 2601, a display portion 2602, a frame body 2603, an external connection port 2604, a remote-control receiving portion 2605, an image receiving portion 2606, a battery 2607, a voice input portion 2608, an operation key 2609, and an eye piece 2610. The video camera can be manufactured by using a semiconductor device that has high electrical characteristics obtained by laser light irradiation as shown in the present invention for the display portion 2602, other circuit, and the like.

Figure 15H:
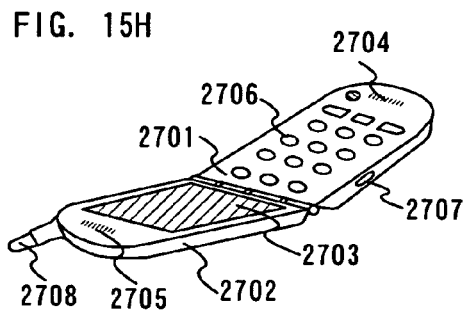

FIG. 15H is a cellular phone, which includes a main body 2701, a frame body 2702, a display portion 2703, a voice input portion 2704, a voice output portion 2705, an operation key 2706, an external connection port 2707, and an antenna 2007. The cellular phone can be manufactured by using a semiconductor device that has high electrical characteristics obtained by laser light irradiation as shown in the present invention for the display portion 2703, other circuit, and the like.

It is to be noted that a semiconductor device that has high electrical characteristics obtained by laser light irradiation as shown in the present invention can be used for a front or rear projector in addition to the electronic devices described above.

As described above, the present invention can be applied quite widely, and can be applied to electronic devices and integrated circuits in all fields.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a semiconductor device comprising:
   forming a semiconductor film on a uniform insulating surface;
   forming a reflective which comprises a first insulating film and a second insulating film, formed over and being in contact with the semiconductor film;
   exposing a portion of the semiconductor film by patterning the reflective film, the portion having a width of 1 to 10 µm; and
   crystallizing the exposed semiconductor film by irradiating a laser light using the patterned reflective film as a mask,
   wherein the first insulating film and the second insulating film comprised in the reflective film are stacked alternately.

2. The method according to claim 1, wherein the first insulating film is a silicon oxide film and the second insulating film is a silicon nitride film formed in contact with the silicon oxide film.

3. The method according to claim 1, wherein patterning the reflective film is performed by dry etching.

4. The method according to claim 1, wherein the patterned reflective film is removed by wet etching.

5. The method according to claim 1, wherein crystal growth proceeds in a lateral direction from a region comprising the semiconductor film provided below the patterned reflective film to a region comprising the exposed semiconductor film.

6. The method according to claim 1, wherein the semiconductor device is any one of a liquid crystal display device, an EL display device, and an integrated circuit.

7. The method according to claim 1, wherein the refractive index of the first insulating film is higher than the second insulating film or the refractive index of the second insulating film is higher than the first insulating film.

8. The method according to claim 1, wherein the reflective film further comprises a third insulating film and a fourth insulating film, wherein the refractive index of the first insulating film and the third insulating film is higher than the second insulating film and the fourth insulating film or the refractive index of the second insulating film and the fourth insulating film is higher than the first insulating film and the third insulating film.

9. The method according to claim 5, wherein a thin film transistor is formed so that a direction in which a carrier moves in a channel forming region of the thin film transistor is parallel to the lateral direction in which crystal growth proceeds.

10. The method according to claim 6, wherein the semiconductor device is incorporated in to an electronic device selected from the group consisting of a video camera, a digital camera, a navigation system, a sound reproduction device, a computer, a game machine, a personal digital assistant, and an image reproduction device.

11. A method for manufacturing a semiconductor device comprising:
    forming a uniform base film over an insulating substrate;
    forming a semiconductor film on the uniform base film, the semiconductor film having a first region and second region;
    forming a reflective film, which comprises a first insulating film and a second insulating film, formed over and being in contact with the semiconductor film;
    exposing the first region of the semiconductor film, the exposed first region having a width of 1 to 10 µm by patterning the reflective film, wherein the second region is covered with the reflective film;
    crystallizing the first region of the semiconductor film by irradiating the first region of the semiconductor film with a laser light using the patterned reflective film as a mask;
    removing the patterned reflective film;
    patterning the semiconductor film;
    forming a gate insulating film on the patterned semiconductor film; and
    forming a gate electrode on the gate insulating film,
    wherein the gate electrode is formed over the crystallized first region, and
    wherein the first insulating film and the second insulating film comprised in the reflective film are stacked alternately.

12. The method according to claim 11, wherein the first insulating film is a silicon oxide film and the second insulating film is a silicon nitride film formed in contact with the silicon oxide film.

13. The method according to claim 11, wherein patterning the reflective film is performed by dry etching.

14. The method according to claim 11, wherein crystal growth proceeds in a lateral direction from the second region of the semiconductor film to the first region of the semiconductor film.

15. The method according to claim 11, wherein the semiconductor device is any one of a liquid crystal display device, an EL display device, and an integrated circuit.

16. The method according to claim 11, wherein the refractive index of the first insulating film is higher than the second insulating film or the refractive index of the second insulating film is higher than the first insulating film.

17. The method according to claim 11, wherein the reflective film further comprises a third insulating film and a fourth insulating film, wherein the refractive index of the first insulating film and the third insulating film is higher than the second insulating film and the fourth insulating film or the refractive index of the second insulating film and the fourth insulating film is higher than the first insulating film and the third insulating film.

18. The method according to claim 13, wherein the patterned reflective film is removed by wet etching.

19. The method according to claim 14, wherein a thin film transistor is formed so that a direction in which a carrier moves in a channel forming region of the thin film transistor is parallel to the lateral direction in which crystal growth proceeds.

20. The method according to claim 15, wherein the semiconductor device is incorporated in to an electronic device selected from the group consisting of a video camera, a digital camera, a navigation system, a sound reproduction device, a computer, a game machine, a personal digital assistant, and an image reproduction device.

21. A method for manufacturing a semiconductor device comprising:
    forming a semiconductor film on a uniform insulating surface;
    forming a reflective film, which comprises a first insulating film and a second insulating film, formed over and being in contact with a first portion of the semiconductor film; and
    crystallizing a second portion of the semiconductor film, the second portion having a width of 1 to 10 µm by irradiating a laser light using the reflective film as a mask,
    wherein the first portion of the semiconductor film is in contact with the reflective film, and
    wherein the first insulating film and the second insulating film comprised in the reflective film are stacked alternately.

22. The method according to claim 21, wherein the first insulating film is a silicon oxide film and the second insulating film is a silicon nitride film formed in contact with the silicon oxide film.

23. The method according to claim 21, wherein the reflective film is patterned by dry etching.

24. The method according to claim 21, wherein crystal growth proceeds in a lateral direction from the portion of the semiconductor film to a portion of the semiconductor film which is not covered with the reflective film.

25. The method according to claim 21, wherein the semiconductor device is any one of a liquid crystal display device, an EL display device, and an integrated circuit.

26. The method according to claim 21, wherein the refractive index of the first insulating film is higher than the second insulating film or the refractive index of the second insulating film is higher than the first insulating film.

27. The method according to claim 21, wherein the reflective film further comprises a third insulating film and a fourth insulating film, wherein the refractive index of the first insulating film and the third insulating film is higher than the second insulating film and the fourth insulating film or the refractive index of the second insulating film and the fourth insulating film is higher than the first insulating film and the third insulating film.

28. The method according to claim 23, wherein the patterned reflective film is removed by wet etching.

29. The method according to claim 24, wherein a thin film transistor is formed so that a direction in which a carrier moves in a channel forming region of the thin film transistor is parallel to the lateral direction in which crystal growth proceeds.

30. The method according to claim 25, wherein the semiconductor device is incorporated in to an electronic device selected from the group consisting of a video camera, a digital camera, a navigation system, a sound reproduction device, a computer, a game machine, a personal digital assistant, and an image reproduction device.

31. A method for manufacturing a semiconductor device comprising:
   forming a semiconductor film on a uniform insulating surface;
   forming a reflective film, which comprises a first insulating film and a second insulating film, formed over and being in contact with a first portion of the semiconductor film; and
   crystallizing a second portion of the semiconductor film, the second portion having a width of 1 to 10 μm by irradiating a laser light using the reflective film as a mask,
   wherein the first portion of the semiconductor film is in contact with the reflective film,
   wherein the second portion of the semiconductor film, which is not covered with the reflective film, is irradiated with the laser light,
   wherein the laser light is reflected by the reflective film, and
   wherein the first insulating film and the second insulating film comprised in the reflective film are stacked alternately.

32. The method according to claim 31, wherein the first insulating film is a silicon oxide film and the second insulating film is a silicon nitride film formed in contact with the silicon oxide film.

33. The method according to claim 31, wherein the reflective film is patterned by dry etching.

34. The method according to claim 31, wherein crystal growth proceeds in a lateral direction from the portion of the semiconductor film to a portion of the semiconductor film which is not covered with the reflective film.

35. The method according to claim 31, wherein the semiconductor device is any one of a liquid crystal display device, an EL display device, and an integrated circuit.

36. The method according to claim 31, wherein the refractive index of the first insulating film is higher than the second insulating film or the refractive index of the second insulating film is higher than the first insulating film.

37. The method according to claim 31, wherein the reflective film further comprises a third insulating film and a fourth insulating film, wherein the refractive index of the first insulating film and the third insulating film is higher than the second insulating film and the fourth insulating film or the refractive index of the second insulating film and the fourth insulating film is higher than the first insulating film and the third insulating film.

38. The method according to claim 33, wherein the patterned reflective film is removed by wet etching.

39. The method according to claim 34, wherein a thin film transistor is formed so that a direction in which a carrier moves in a channel forming region of the thin film transistor is parallel to the lateral direction in which crystal growth proceeds.

40. The method according to claim 35, wherein the semiconductor device is incorporated in to an electronic device selected from the group consisting of a video camera, a digital camera, a navigation system, a sound reproduction device, a computer, a game machine, a personal digital assistant, and an image reproduction device.

41. A method for manufacturing a semiconductor device comprising:
   forming a semiconductor film on a uniform insulating surface;
   forming a reflective film, which comprises a first insulating film and a second insulating film, formed over and being in contact with a first portion of the semiconductor film; and
   crystallizing a second portion of the semiconductor film, the second portion having a width of 1 to 10 μm by irradiating a laser light using the reflective film as a mask,
   wherein the first portion of the semiconductor film is in contact with the reflective film,
   wherein the second portion of the semiconductor film is covered by the reflective film,
   wherein the first portion of the semiconductor film is not melted by the irradiation of the laser light, and
   wherein the first insulating film and the second insulating film comprised in the reflective film are stacked alternately.

42. The method according to claim 41, wherein the first insulating film is a silicon oxide film and the second insulating film is a silicon nitride film formed in contact with the silicon oxide film.

43. The method according to claim 41, wherein the reflective film is patterned by dry etching.

44. The method according to claim 41, wherein crystal growth proceeds in a lateral direction from the portion of the semiconductor film to a portion of the semiconductor film which is not covered with the reflective film.

45. The method according to claim 41, wherein the semiconductor device is any one of a liquid crystal display device, an EL display device, and an integrated circuit.

46. The method according to claim 41, wherein the refractive index of the first insulating film is higher than the second insulating film or the refractive index of the second insulating film is higher than the first insulating film.

47. The method according to claim 41, wherein the reflective film further comprises a third insulating film and a fourth insulating film, wherein the refractive index of the first insulating film and the third insulating film is higher than the second insulating film and the fourth insulating film or the refractive index of the second insulating film and the fourth insulating film is higher than the first insulating film and the third insulating film.

48. The method according to claim 43, wherein the patterned reflective film is removed by wet etching.

49. The method according to claim 44, wherein a thin film transistor is formed so that a direction in which a carrier moves in a channel forming region of the thin film transistor is parallel to the lateral direction in which crystal growth proceeds.

50. The method according to claim 45, wherein the semiconductor device is incorporated in to an electronic device selected from the group consisting of a video camera, a digital camera, a navigation system, a sound reproduction device, a computer, a game machine, a personal digital assistant, and an image reproduction device.

* * * * *

UNITED STATES PATENT AND TRADEMARK OFFICE
CERTIFICATE OF CORRECTION

| | | |
|---|---|---|
| PATENT NO. | : 7,696,031 B2 | Page 1 of 1 |
| APPLICATION NO. | : 11/150285 | |
| DATED | : April 13, 2010 | |
| INVENTOR(S) | : Akihisa Shimomura et al. | |

It is certified that error appears in the above-identified patent and that said Letters Patent is hereby corrected as shown below:

At column 30, line 35, please change "reflective which" to --reflective film, which--.

Signed and Sealed this
Thirteenth Day of September, 2011

David J. Kappos
*Director of the United States Patent and Trademark Office*